US012022749B2

(12) United States Patent
Topaloglu et al.

(10) Patent No.: US 12,022,749 B2
(45) Date of Patent: Jun. 25, 2024

(54) FLUX BIAS LINE LOCAL HEATING DEVICE

(71) Applicant: International Business Machines Corporation, Armonk, NY (US)

(72) Inventors: Rasit Onur Topaloglu, Poughkeepsie, NY (US); Vivekananda P. Adiga, Ossining, NY (US); Martin O. Sandberg, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 734 days.

(21) Appl. No.: 16/808,991

(22) Filed: Mar. 4, 2020

(65) Prior Publication Data
US 2021/0280633 A1 Sep. 9, 2021

(51) Int. Cl.
| *H10N 69/00* | (2023.01) |
| *H10N 60/12* | (2023.01) |
| *H10N 60/80* | (2023.01) |
| H10N 60/30 | (2023.01) |
| H10N 60/84 | (2023.01) |

(52) U.S. Cl.
CPC ............ *H10N 69/00* (2023.02); *H10N 60/12* (2023.02); *H10N 60/805* (2023.02); *H10N 60/30* (2023.02); *H10N 60/84* (2023.02)

(58) Field of Classification Search
None
See application file for complete search history.

(56) References Cited

U.S. PATENT DOCUMENTS

| 3,913,120 | A | * | 10/1975 | Lahiri | ............... | H10N 69/00 331/107 S |
| 5,323,344 | A | * | 6/1994 | Katayama | ............ | H10N 69/00 365/210.11 |
| 5,326,986 | A | * | 7/1994 | Miller, Jr. | ............ | G01R 33/035 327/527 |
| 6,025,713 | A | | 2/2000 | Morooka et al. | | |
| 6,728,131 | B2 | | 4/2004 | Ustinov | | |
| 7,042,004 | B2 | | 5/2006 | Magnus et al. | | |
| 7,990,662 | B2 | | 8/2011 | Berkley et al. | | |

(Continued)

FOREIGN PATENT DOCUMENTS

| AU | 2012279307 A1 | 12/2013 | | |
| CA | 3088449 A1 | * 8/2019 | ............ | B82Y 10/00 |

(Continued)

OTHER PUBLICATIONS

Longobardi et al., "Development and Testing of Persistent Flux Bias for Qubits", IEEE Transactions on Applied Superconductivity, vol. 17, No. 2 (2007), 2 pages. (Year: 2007).*

(Continued)

*Primary Examiner* — Scott B Geyer
(74) *Attorney, Agent, or Firm* — Amin, Turocy & Watson, LLP

(57) ABSTRACT

Devices, systems, and/or methods that can facilitate local heating of a superconducting flux biasing loop are provided. According to an embodiment, a device can comprise a substrate having a superconducting flux bias circuit comprising a biasing loop coupled to a flux controlled qubit device. The device can further comprise a heating device coupled to the biasing loop.

14 Claims, 27 Drawing Sheets

(56) References Cited

U.S. PATENT DOCUMENTS

| | | | |
|---|---|---|---|
| 8,138,880 B2 | 3/2012 | Keefe et al. | |
| 8,405,390 B2 | 3/2013 | Pannetier-Lecoeur et al. | |
| 8,536,566 B2 | 9/2013 | Johansson et al. | |
| 8,812,066 B2 | 8/2014 | Lanting et al. | |
| 10,374,611 B2 | 8/2019 | Najafi | |
| 10,467,544 B2 | 11/2019 | Filipp et al. | |
| 10,497,503 B2 | 12/2019 | Faley et al. | |
| 10,665,635 B1* | 5/2020 | Sandberg | G06N 10/00 |
| 2001/0025012 A1* | 9/2001 | Tarutani | H03F 19/00 505/100 |
| 2005/0107261 A1* | 5/2005 | Cantor | G01R 33/0052 505/100 |
| 2005/0162302 A1 | 7/2005 | Omelyanchouk et al. | |
| 2009/0168286 A1 | 7/2009 | Berkley et al. | |
| 2010/0026447 A1 | 2/2010 | Keefe et al. | |
| 2011/0057169 A1* | 3/2011 | Harris | G06N 10/00 977/933 |
| 2012/0135867 A1 | 5/2012 | Thom et al. | |
| 2013/0098895 A1 | 4/2013 | Swanson et al. | |
| 2013/0278283 A1 | 10/2013 | Berkley et al. | |
| 2015/0372217 A1 | 12/2015 | Schoelkopf et al. | |
| 2016/0079968 A1 | 3/2016 | Strand et al. | |
| 2018/0054201 A1 | 2/2018 | Reagor et al. | |
| 2018/0145631 A1* | 5/2018 | Berkley | H03H 7/01 |
| 2018/0322408 A1 | 11/2018 | Chen et al. | |
| 2018/0342663 A1 | 11/2018 | Ferguson et al. | |
| 2019/0044047 A1 | 2/2019 | Elsherbini et al. | |
| 2019/0065981 A1* | 2/2019 | Chen | H10N 69/00 |
| 2019/0164077 A1 | 5/2019 | Roberts et al. | |
| 2019/0305037 A1 | 10/2019 | Michalak et al. | |
| 2020/0058349 A1* | 2/2020 | Najafi | H10N 60/84 |
| 2021/0007000 A1 | 1/2021 | Donggun et al. | |
| 2021/0102838 A1* | 4/2021 | Jordan | G01J 1/0252 |
| 2022/0094320 A1* | 3/2022 | Vesterinen | H03F 7/00 |

FOREIGN PATENT DOCUMENTS

| | | |
|---|---|---|
| JP | H07294615 A | 11/1995 |
| JP | 2019-521546 A | 7/2019 |
| WO | 2009/052635 A1 | 4/2009 |
| WO | 2013/006375 A3 | 3/2013 |
| WO | 2018/004634 A1 | 1/2018 |
| WO | 2018/182571 A1 | 10/2018 |
| WO | 2019/222514 A1 | 11/2019 |

OTHER PUBLICATIONS

Yokosawa et al., "Low-Tc SQUIDs with a built-in heater module to remove flux trapping", Superconductor Science and Technology, 13 (2000), 7 pages. (Year: 2000).*

Podd et al., "Micro-SQUIDs with controllable asymmetry via hot-phonon controlled junctions", Physical Review B, 75 (2007), 13 pages. (Year: 2007).*

Angers et al., "Proximity dc squids in the long-junction limit", Physical Review B, 77 (2008), 12 pages. (Year: 2008).*

Lanting et al., "Geometrical dependence of the low-frequency noise in superconducting flux qubits", Physical Review B, 79 (2009), 4 pages. (Year: 2009).*

Harris et al., "Compound Josephson-junction coupler for flux qubits with minimal crosstalk", Physical Review B, 80 (2009), 4 pages. (Year: 2009).*

Non-Final Office Action received for U.S. Appl. No. 16/395,061 dated Oct. 8, 2019, 25 pages.

Mr. SQUID User's Guide, STAR Cryoelectonics, LLC 1996-2000, New Mexico, U.S.A.

International Search Report and Written Opinion received for PCT Application Serial No. PCT/EP2021/052533 dated May 7, 2021, 10 pages.

Longobardi et al., "Studies of Quantum Transitions of Magnetic Flux in a rf SQUID Qubit", Stony Brook University, XP055670098, Jan. 1, 2009, pp. 91-95.

Gardas et al., "Energetics of an rf SQUID Coupled to Two Thermal Reservoirs," PloS one, 10(12), e0143912, DOI:10.1371/journal. pone.0143912, Dec. 7, 2015, 10 pages.

Kher, "Superconducting Nonlinear Kinetic Inductance Devices," Doctoral dissertation, California Institute of Technology, 2017, 173 pages.

Pobell, "Matter and Methods at Low Temperatures," Third, Revised and Expanded Edition, Springer, 2007, 467 pages.

Harris et al., "Towards Quantum-Limited Cryogenic Amplification for Multi-Qubit Platforms," Sandia National Lab. (SNL-NM), No. SAND2019-11768R, 9 pages.

Foley et al., Why NanoSQUIDs are important: an introduction to the focus issue, Superconductor Science and Technology, 22(6), May 14, 2009, 5 pages.

Tafuri et al., "Weak links in high critical temperature superconductors," Reports on Progress in Physics, 68(11), Sep. 7, 2005, 91 pages.

International Search Report and Written Opinion received for PCT Application Serial No. PCT/EP2021/052534 dated May 7, 2021, 11 pages.

Australian Examination Report No. 1 received for Australian Patent Application Serial No. 2020263787 dated Sep. 1, 2022, 3 pages.

Longobardi L. et al., "Development and Testing of a Persistent Flux Bias for Qubits", IEEE Transactions on Applied Superconductivity, vol. 17, No. 2, Jun. 1, 2007, pp. 88-89, DOI: 10.1109/TASC.2007. 897413 [1] Category: X Claims:1-17.

Office Action received for Korean Patent Application Serial No. 10-2021-7030980 dated Aug. 23, 2022, 17 pages.

8 Non Final Office Action received for U.S. Appl. No. 16/808,974 dated Jan. 20, 2023, 31 pages.

Notice of Reasons for Refusal dated Jun. 8, 2023 for JP Application No. 2021-562059.

Longobardi, et al., "Development and Testing of a Persistent Flux Bias for Qubits," IEEE Transactions on Applied Superconductivity, Jun. 2007, and vol. 17, No. 2, pp. 88-89 and DOI:10.1109-/TASC. 2007.897413.

Search report received for Singapore Patent Application Serial No. 11202109840W dated Oct. 20, 2023, 2 pages.

Ex-Parte Quayle Action received for U.S. Appl. No. 16/808,974 dated Oct. 19, 2023, 31 pages.

Li et al., "Remote Sensing and Control of Phase Qubits", Applied Physics Letters, vol. 97, No. 102507, 2010, 3 pages.

Yan et al., "The Flux Qubit Revisited to Enhance Coherence and Reproducibility", Nature Communications, vol. 7, No. 12964, Nov. 3, 2016, 9 pages.

Lee et al., "Nonlinear Resonant Behavior of a Dispersive Readout Circuit for a Superconducting Flux Qubit", Physical Review, B, vol. 75, No. 144505, 2007, 10 pages.

Schwarz et al., "Gradiometric Flux Qubits with a Tunable Gap", New Journal of Physics, vol. 15, No. 045001, 2013, 21 pages.

Shcherbakova et al., "Fabrication and Measurements of Hybrid Nb/Al Josephson Junctions and Flux Qubits with Tr-shifters", Superconductor Science and Technology, vol. 28, No. 025009, 2015, 5 pages.

Final Office Action received for U.S. Appl. No. 16/808,974 dated Aug. 10, 2023, 27 pages.

Examination Report No. 1 received for Australian Patent Application Serial No. 2020263787 dated Aug. 3, 2023, 3 pages.

Notice of Allowance received for U.S. Appl. No. 16/808,974 dated Dec. 13, 2023, 53 pages.

Decision to Grant a Patent received for Japanese Patent Application Serial No. 2021-562059, dated Nov. 28, 2023, 5 pages(Including English Translation).

* cited by examiner

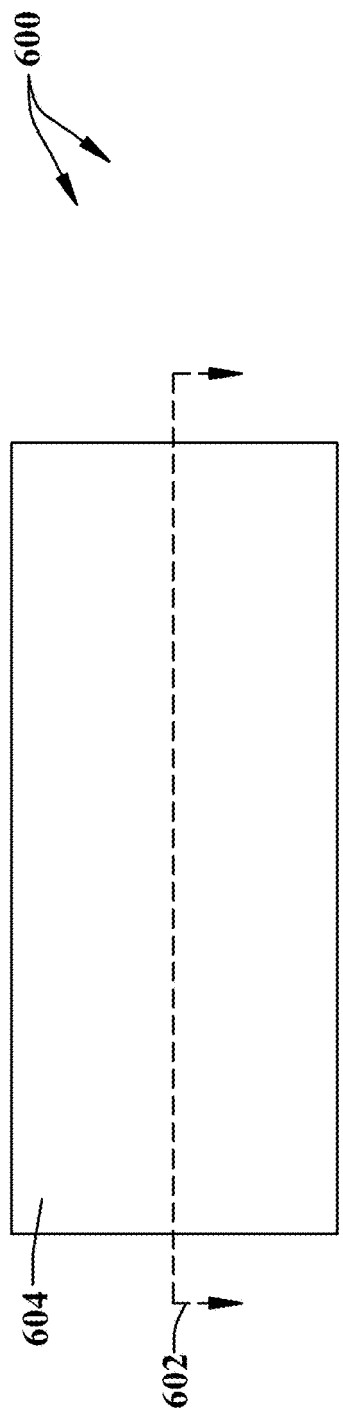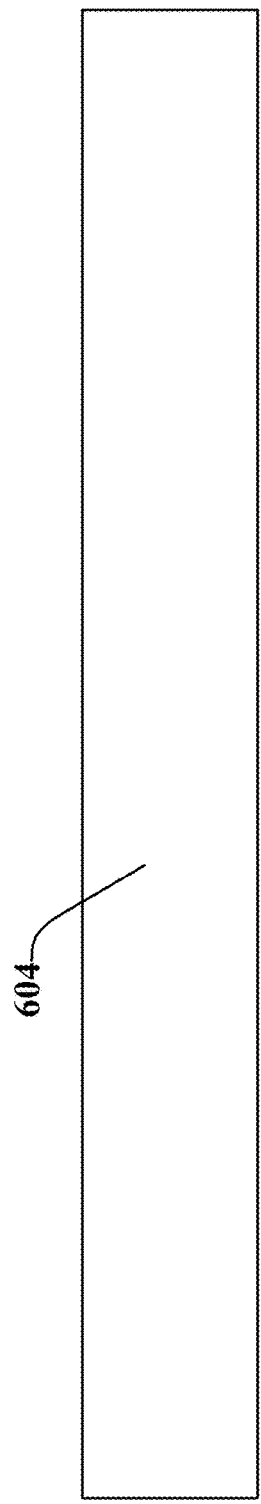

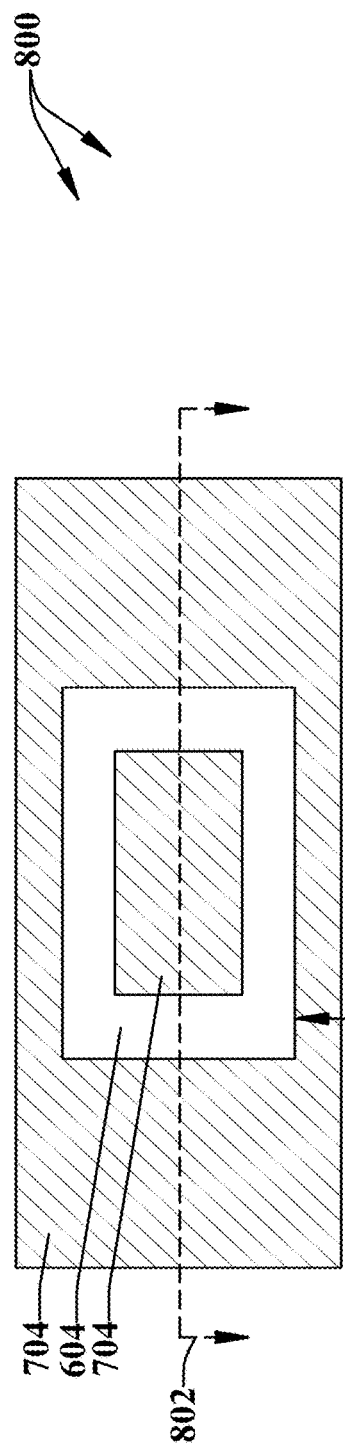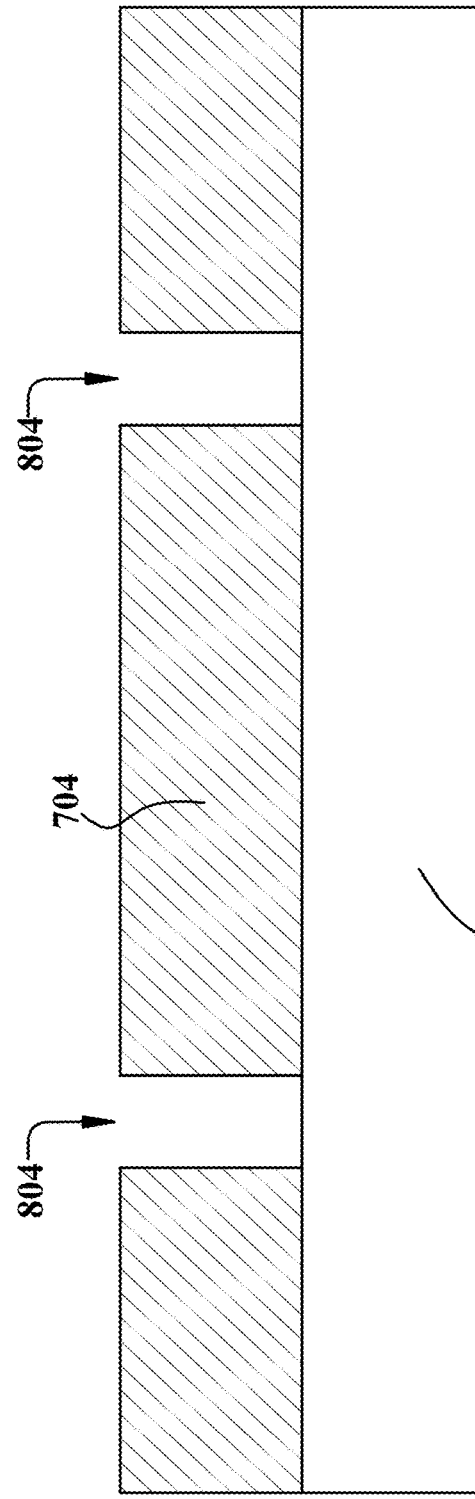

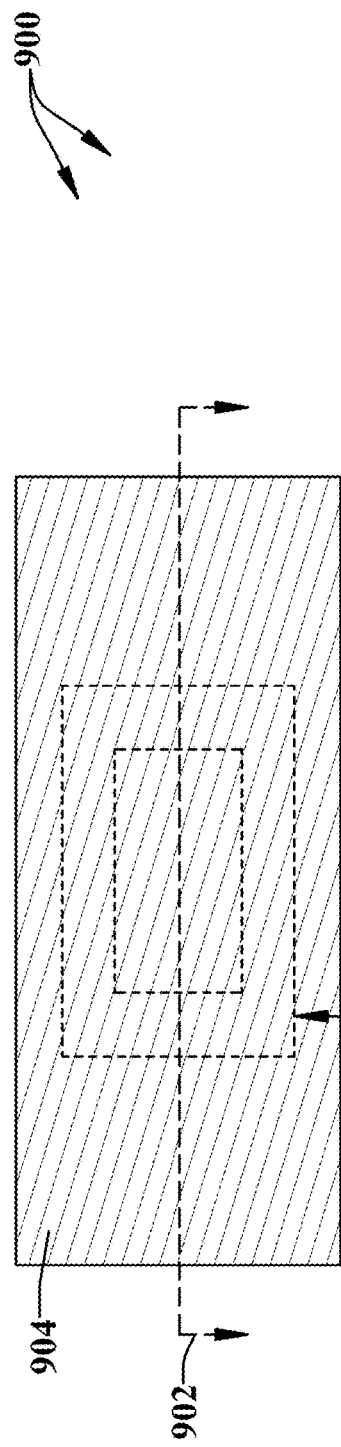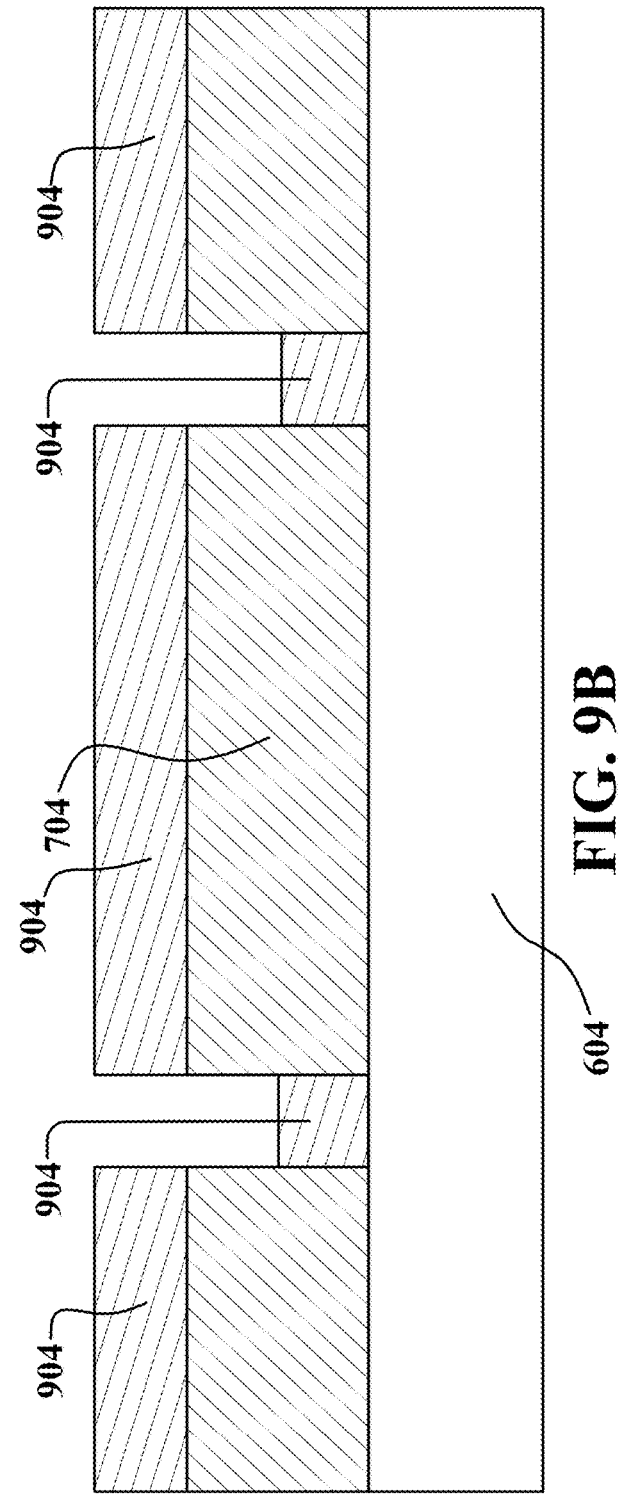

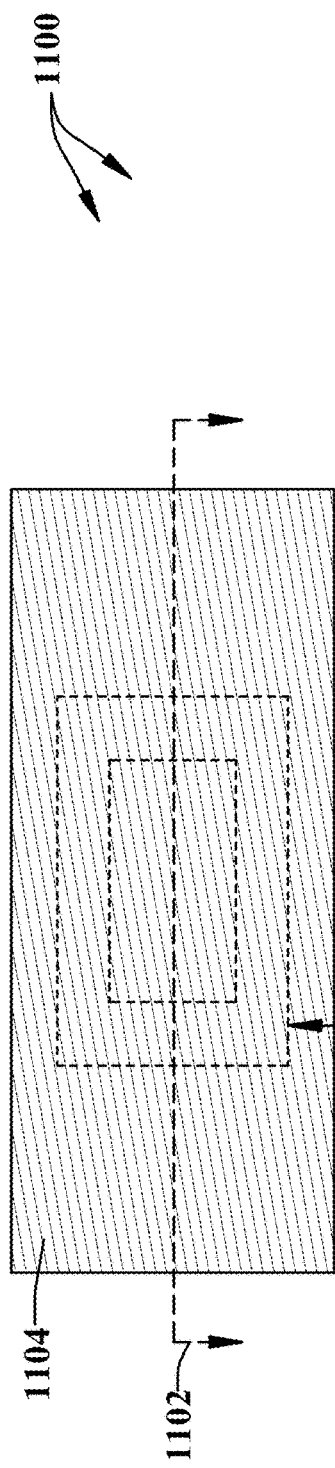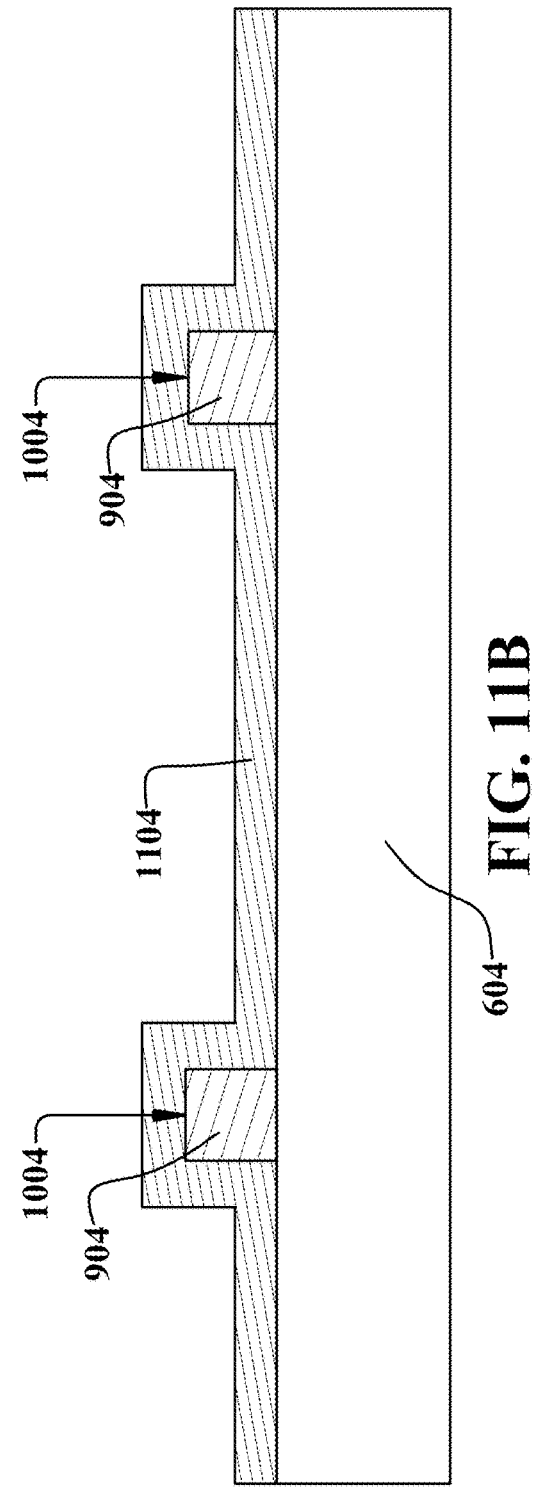

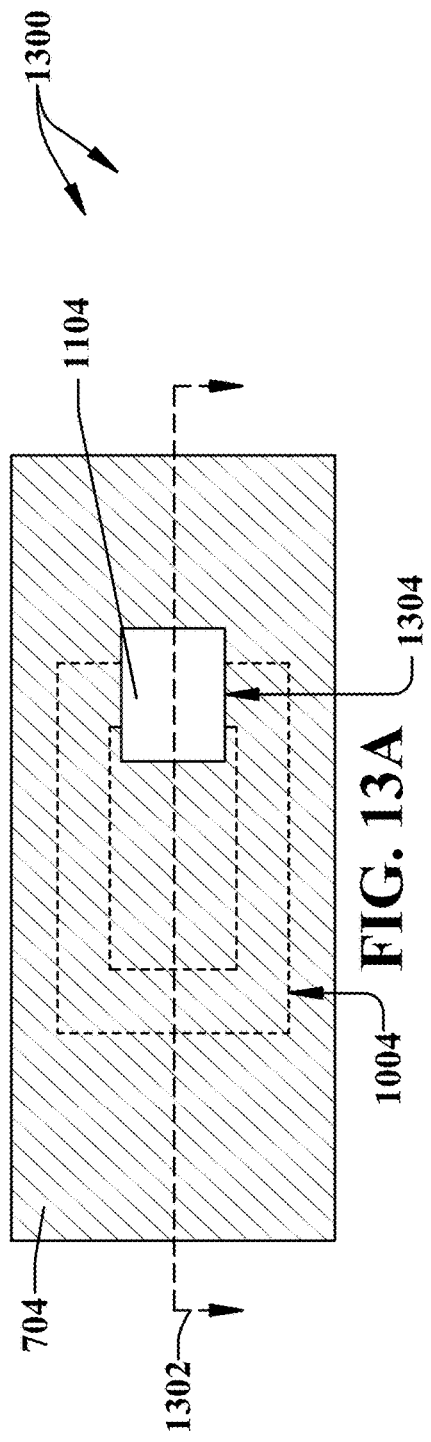
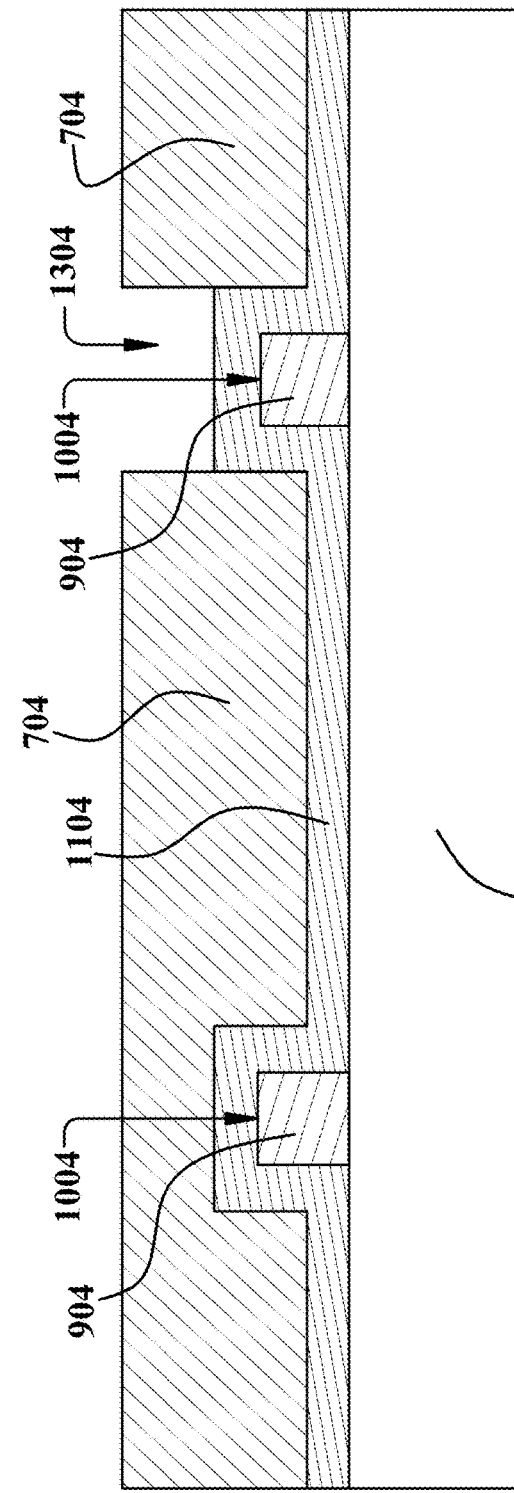
FIG. 13A
FIG. 13B

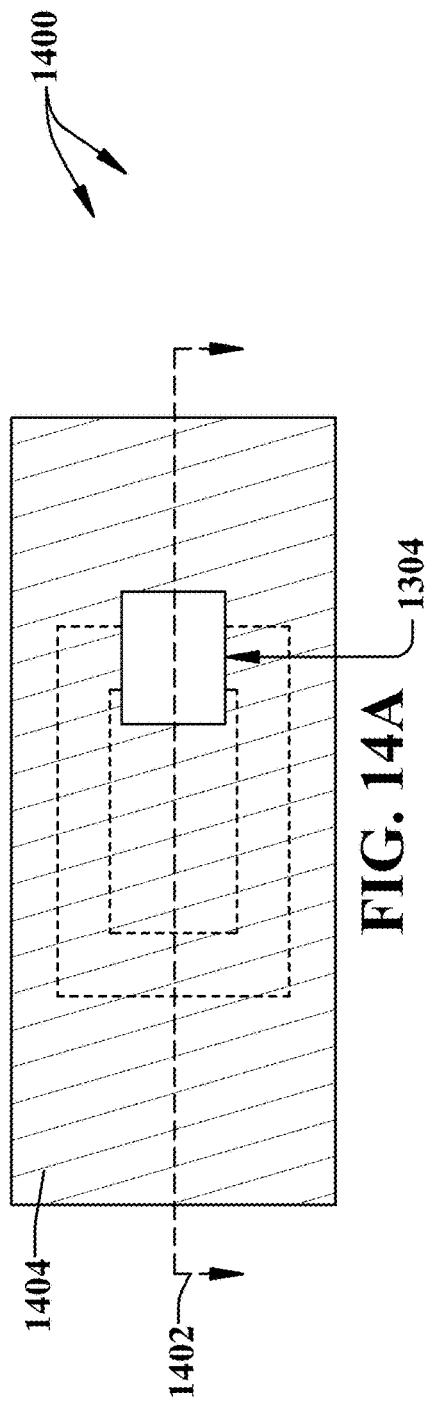
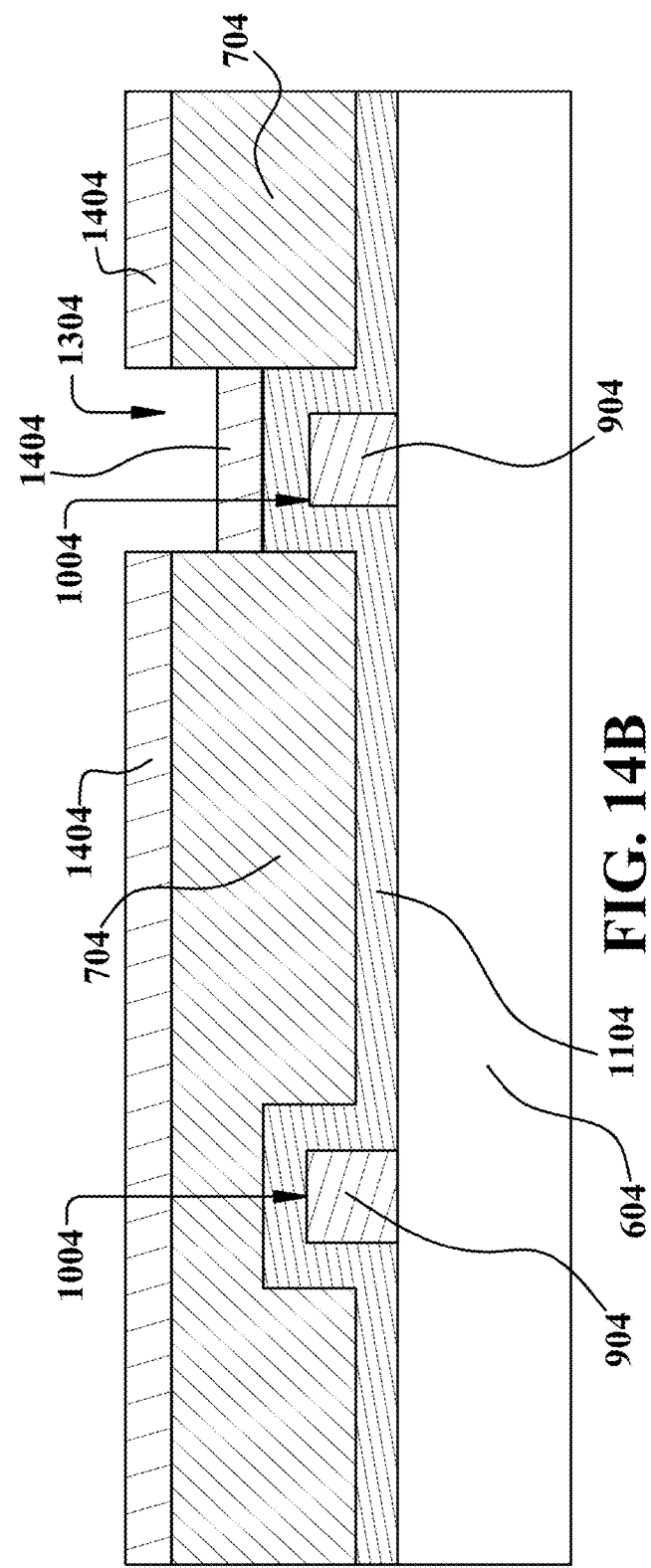
FIG. 14A
FIG. 14B

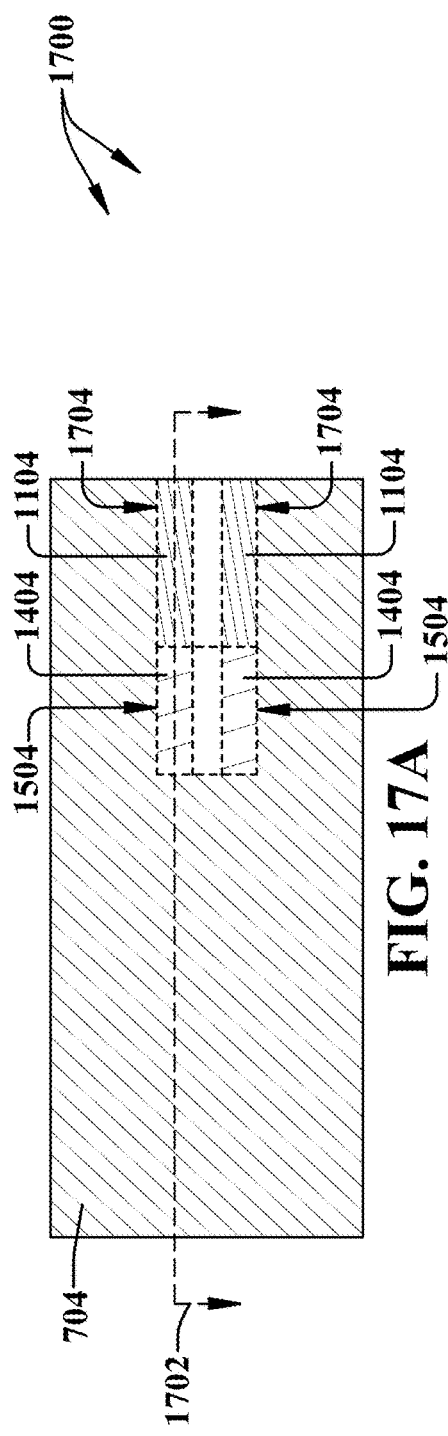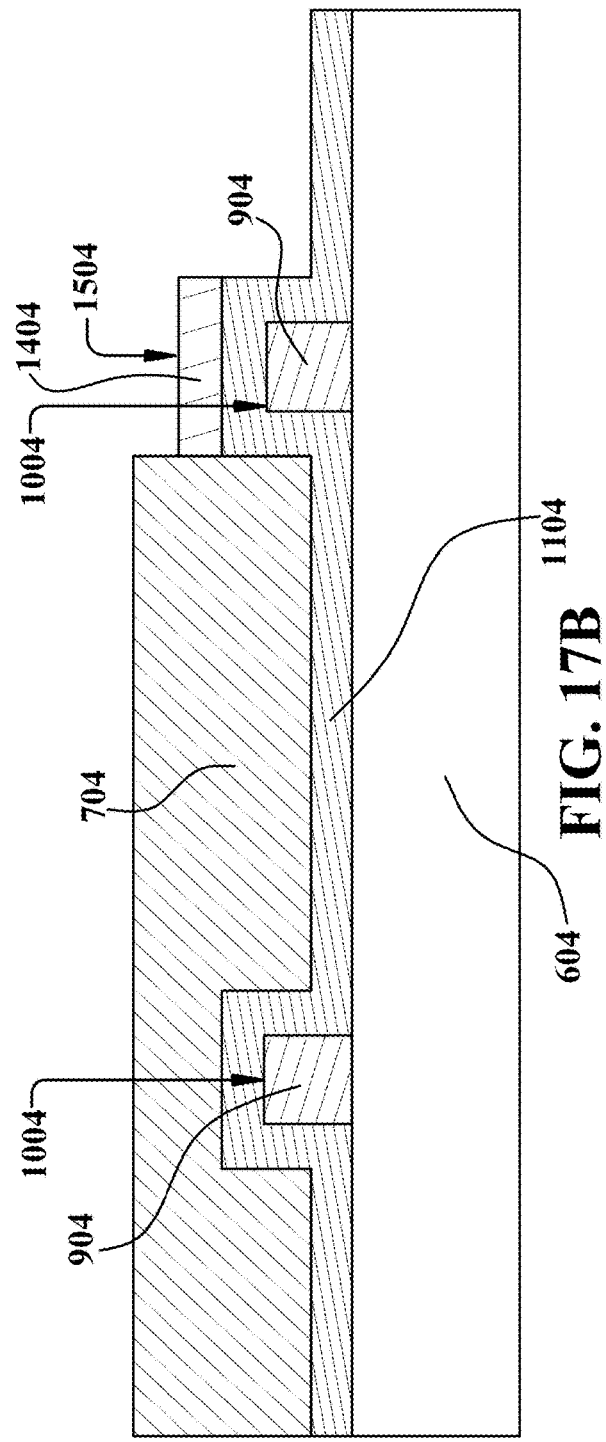
FIG. 17A
FIG. 17B

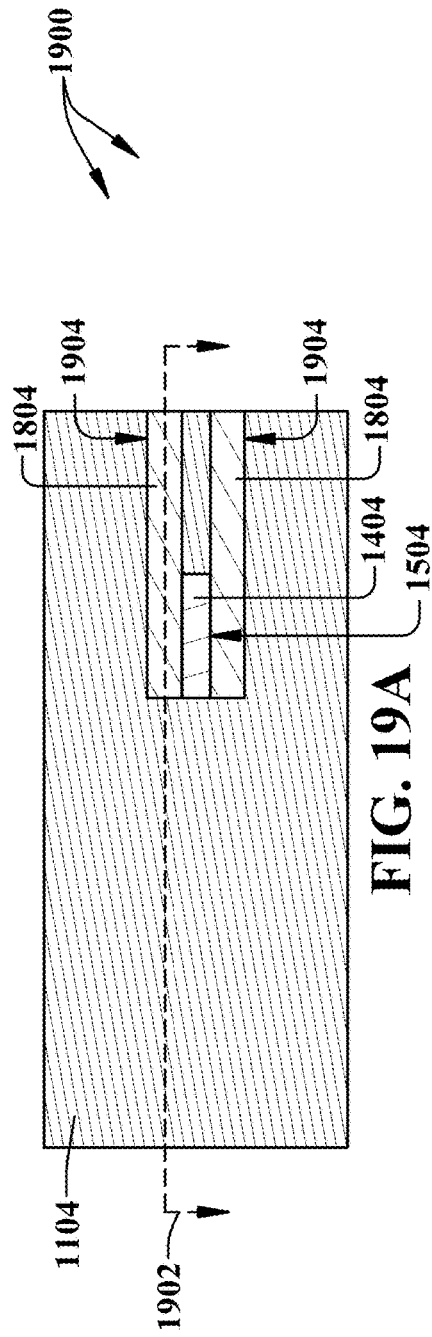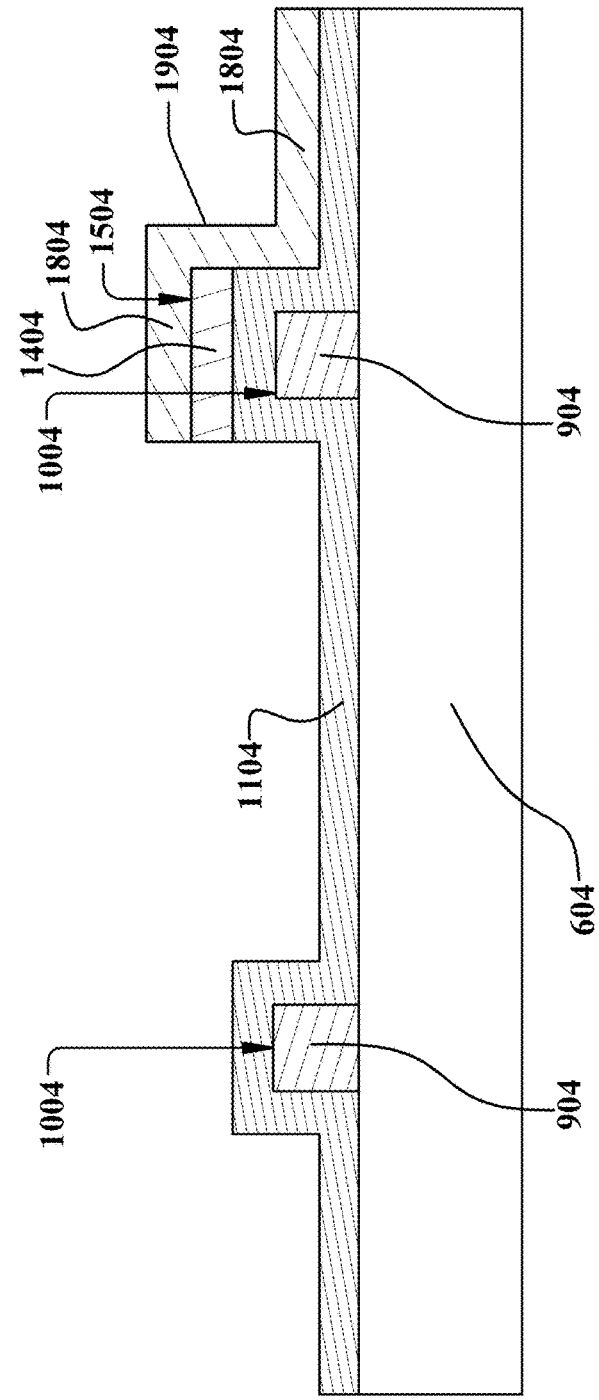

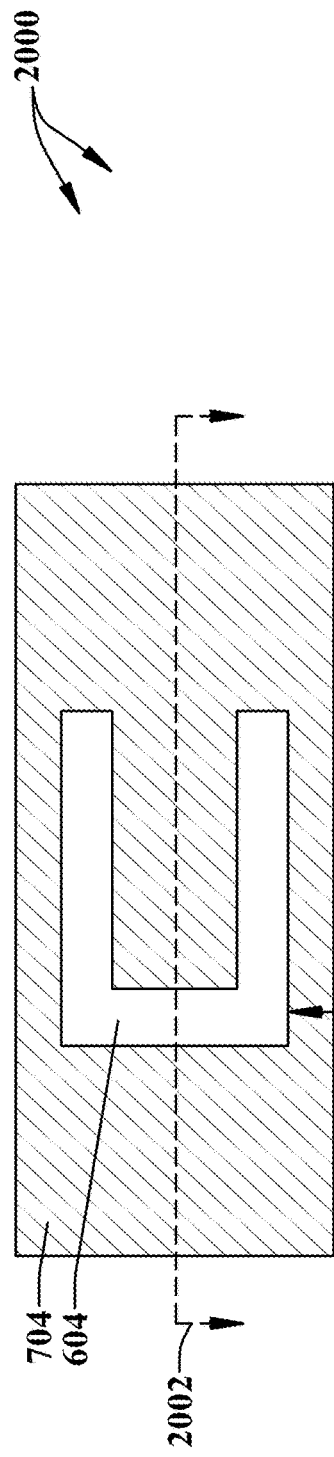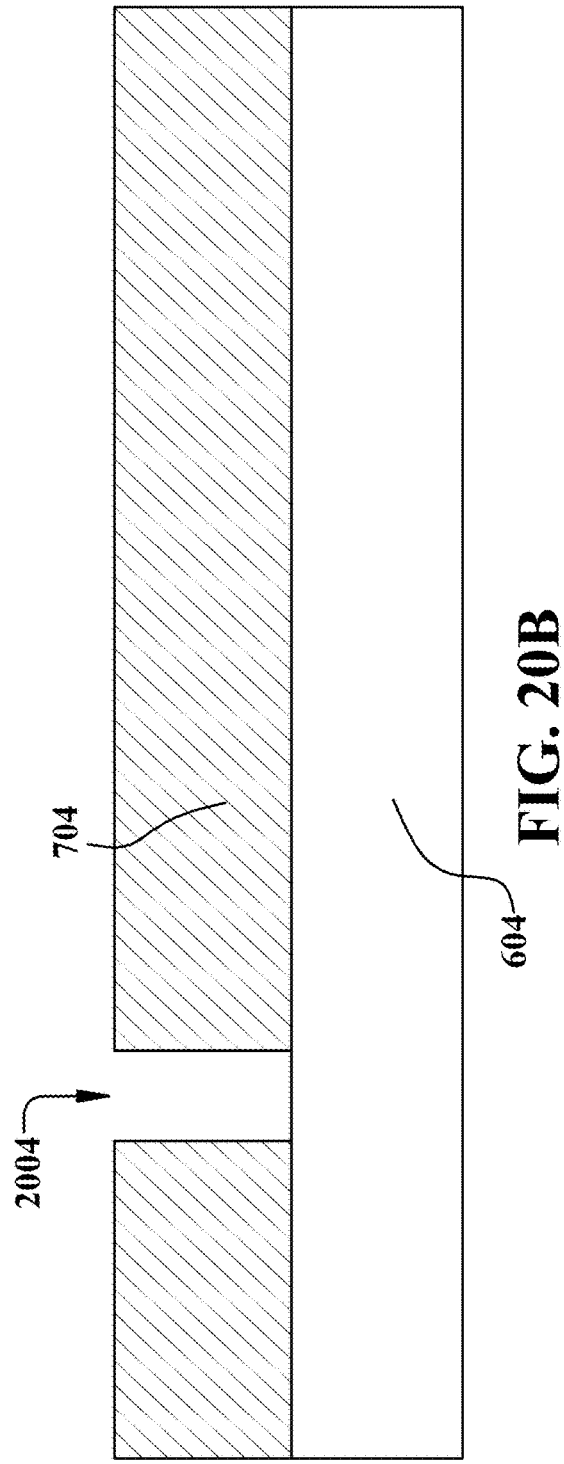

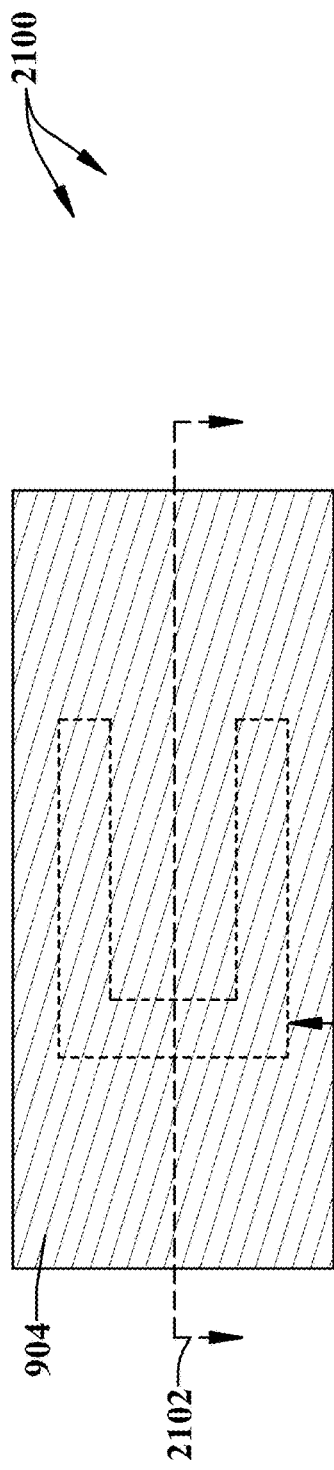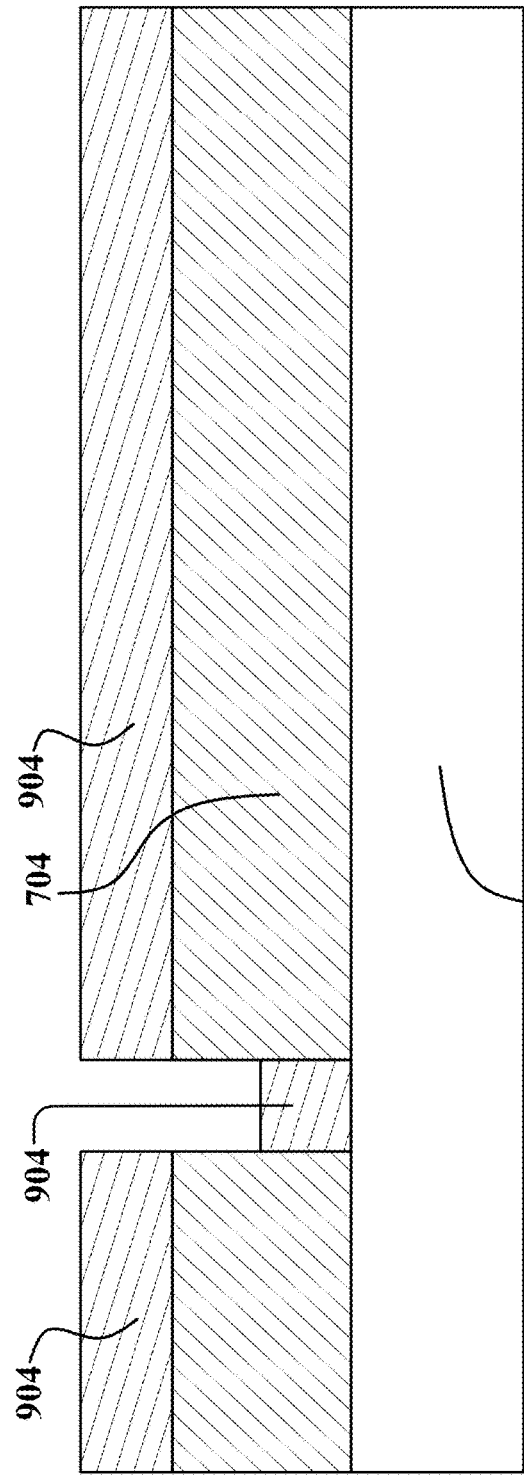
FIG. 21A
FIG. 21B

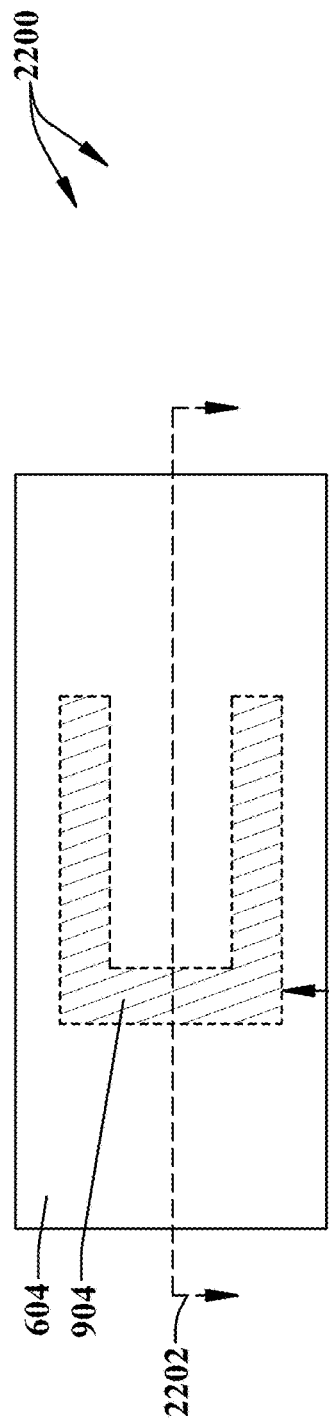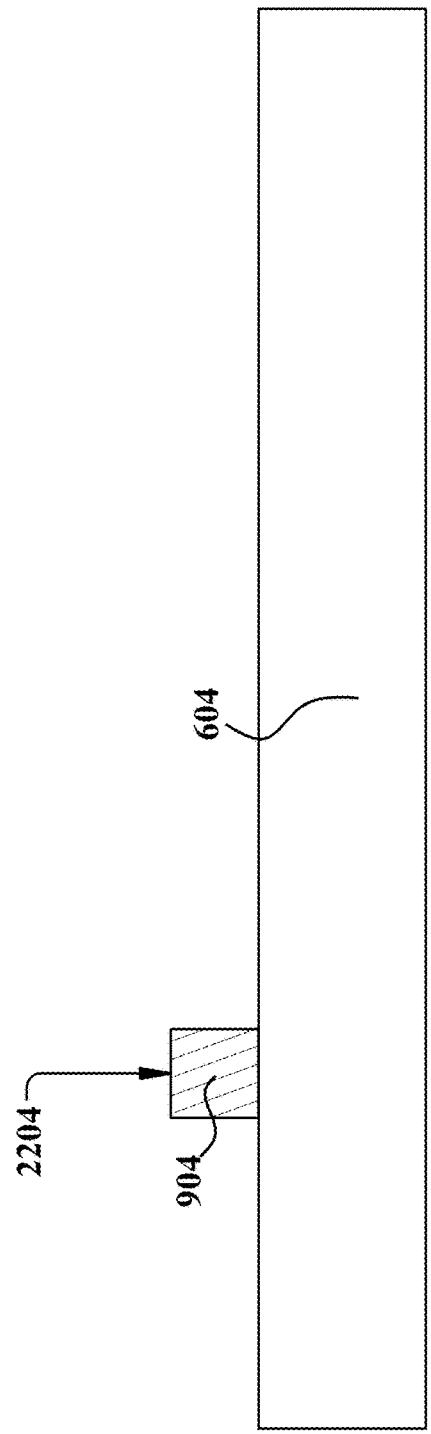

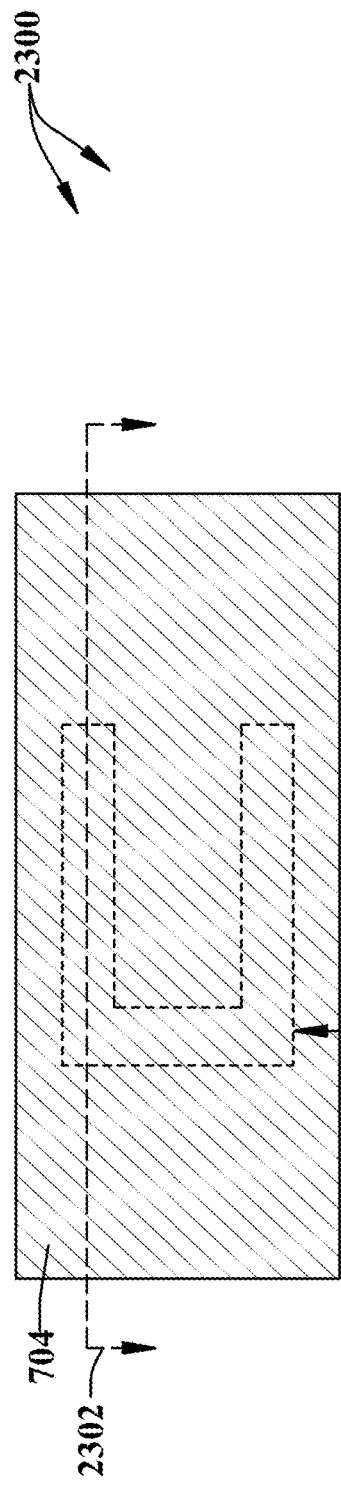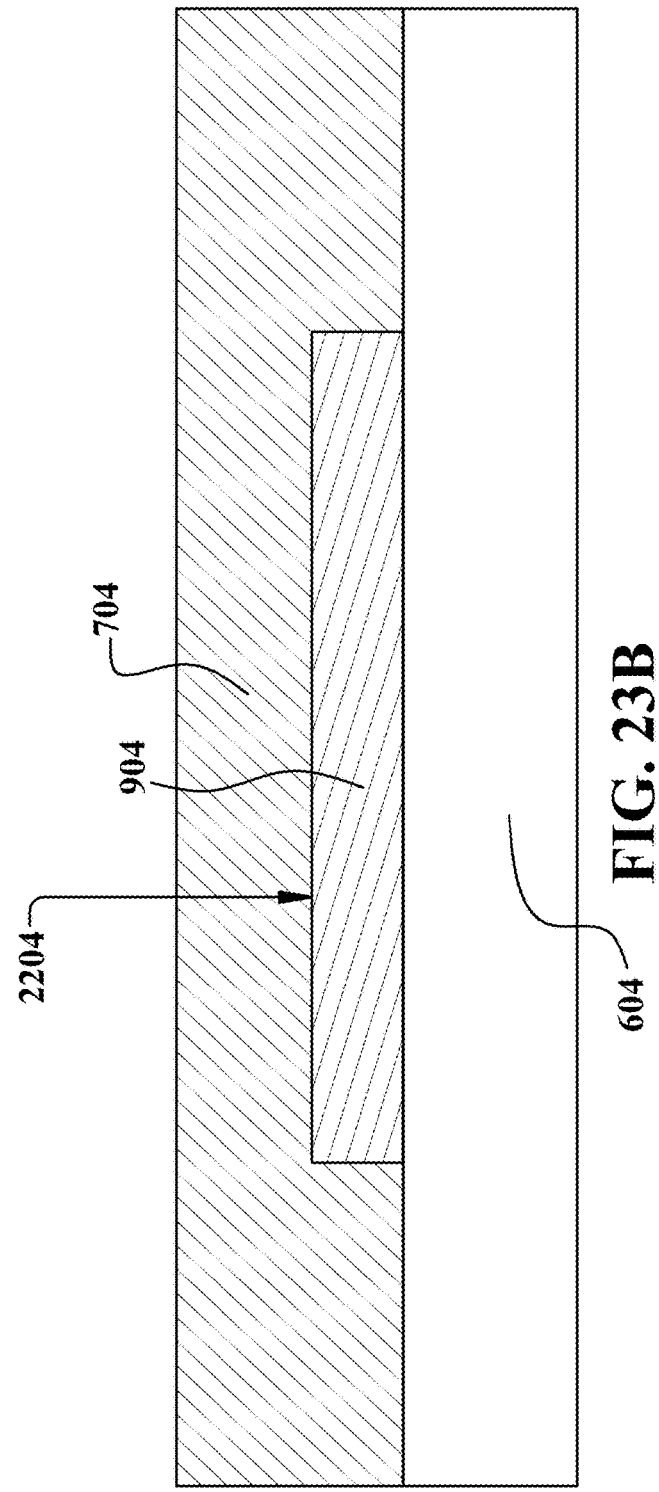

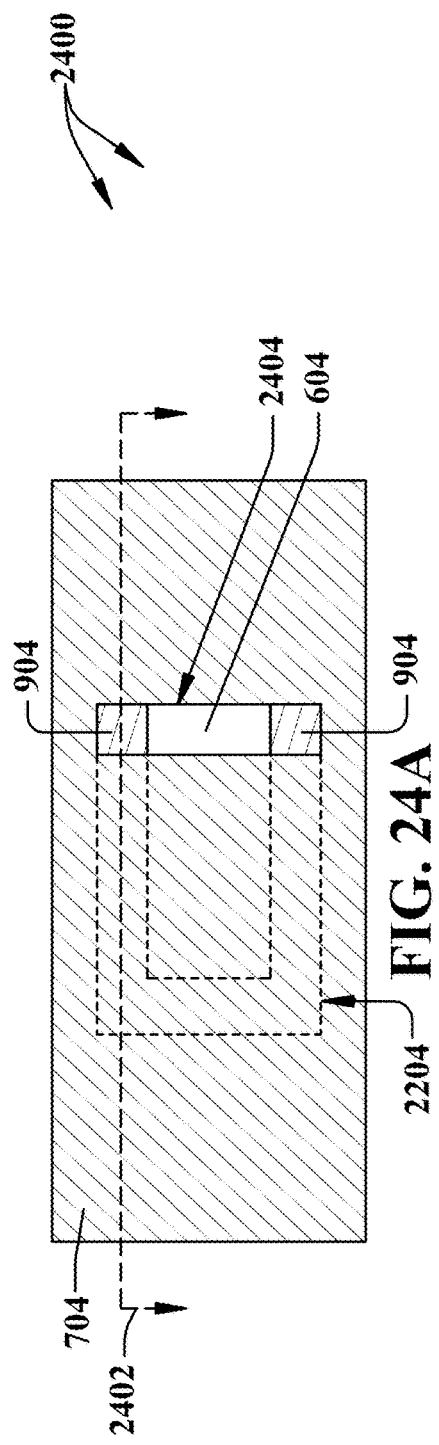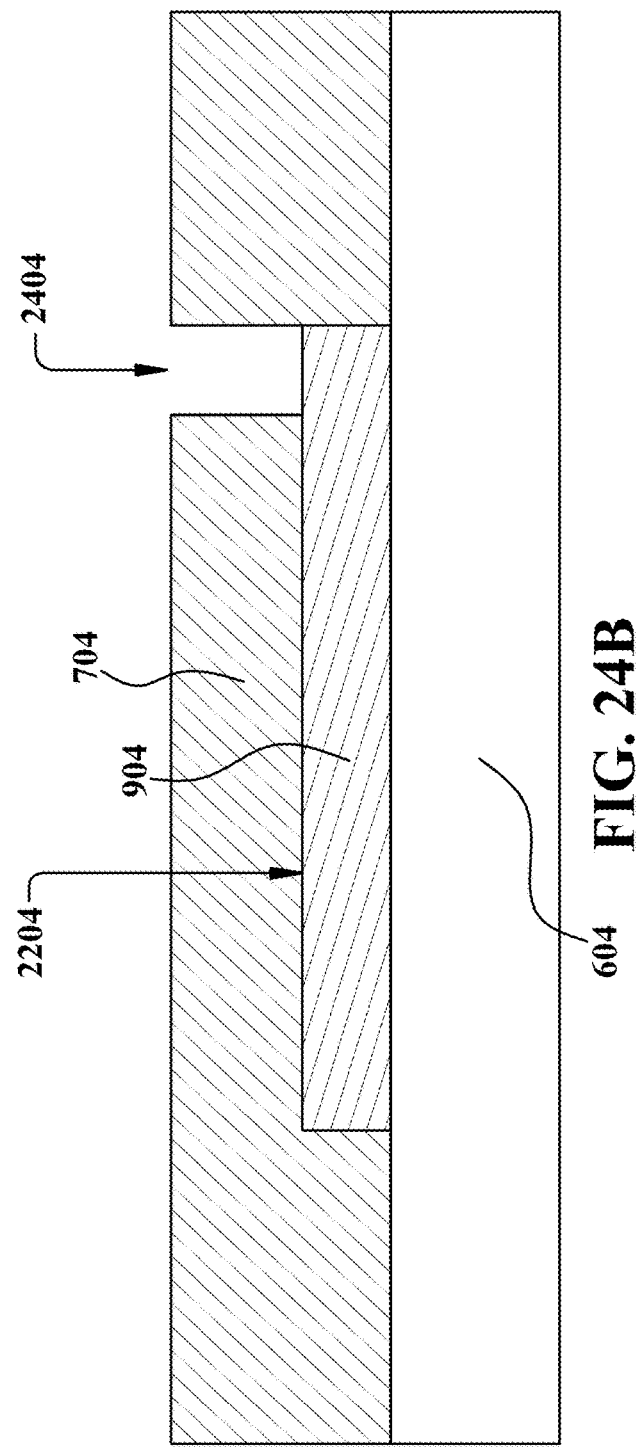

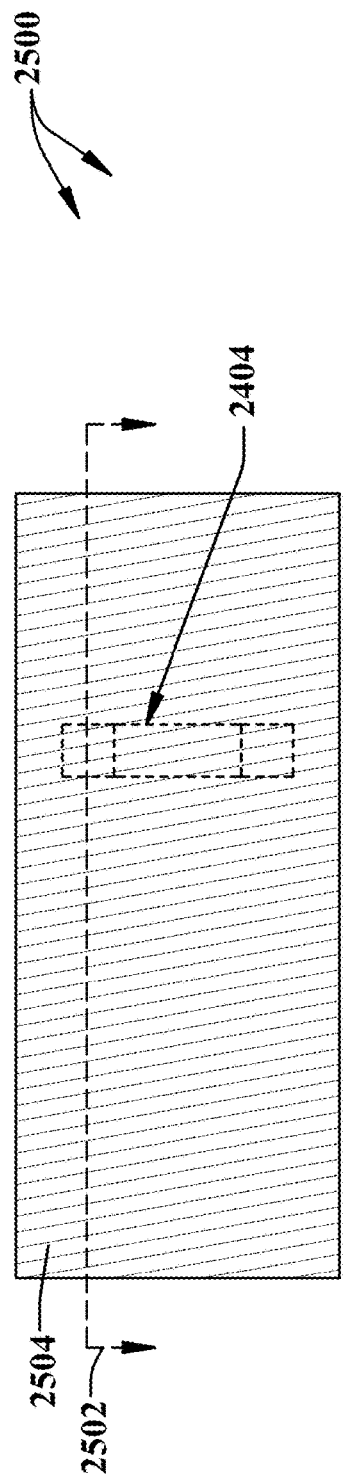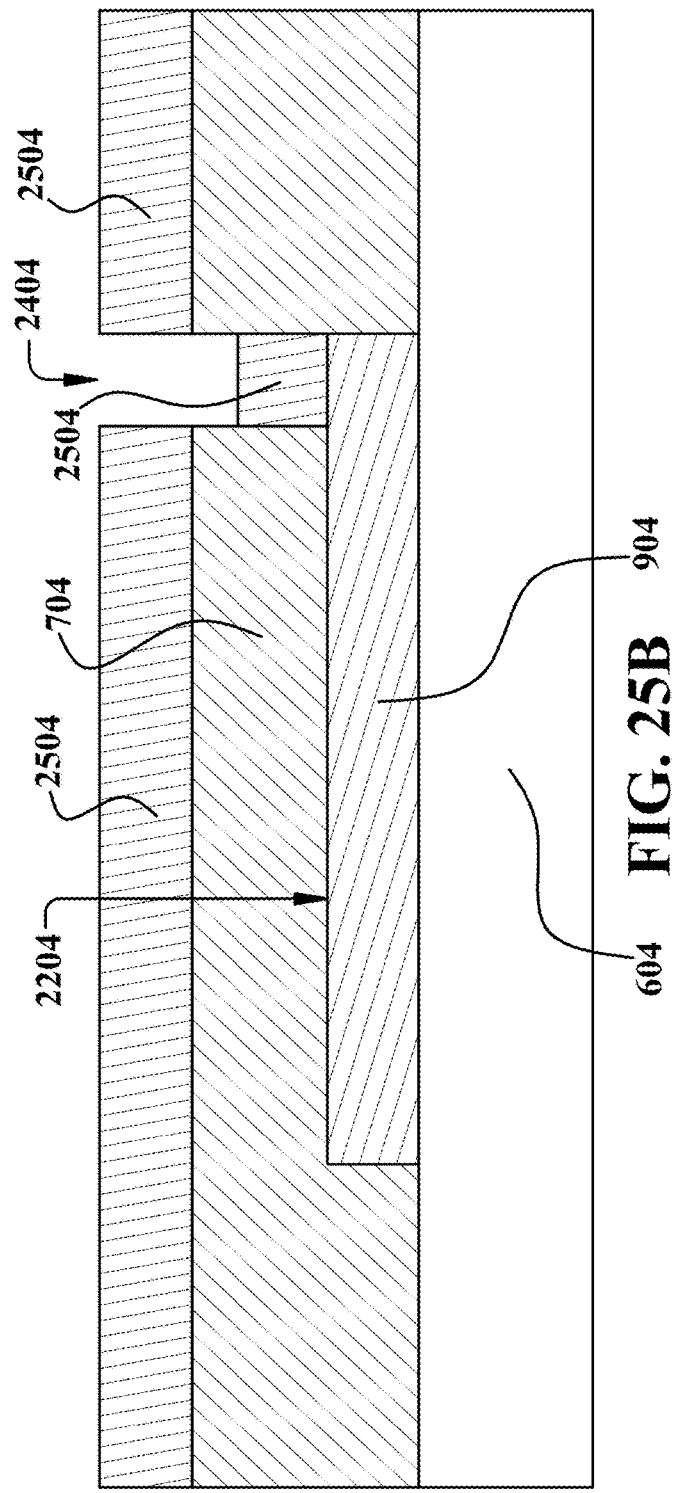
FIG. 25A
FIG. 25B

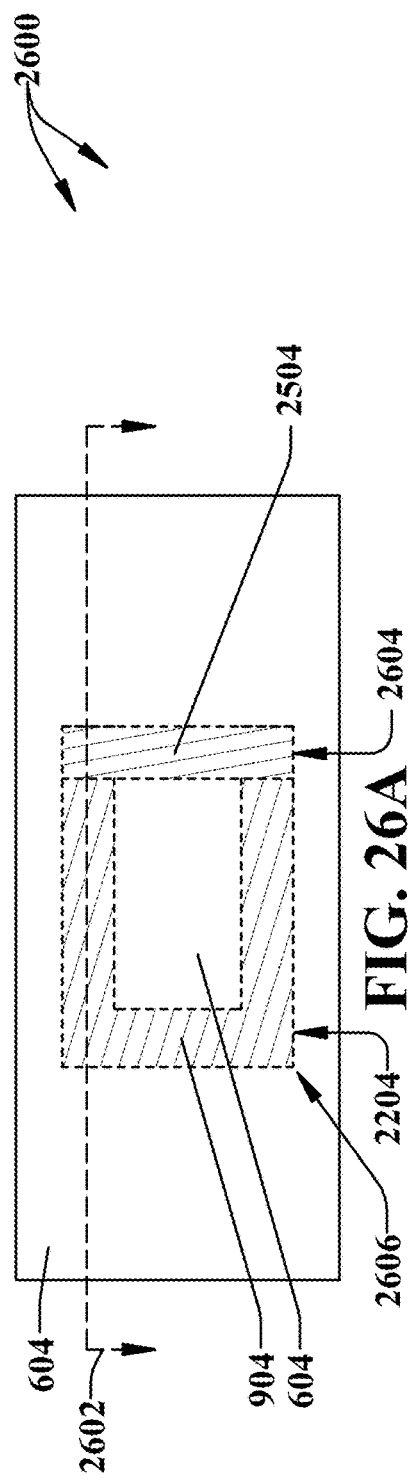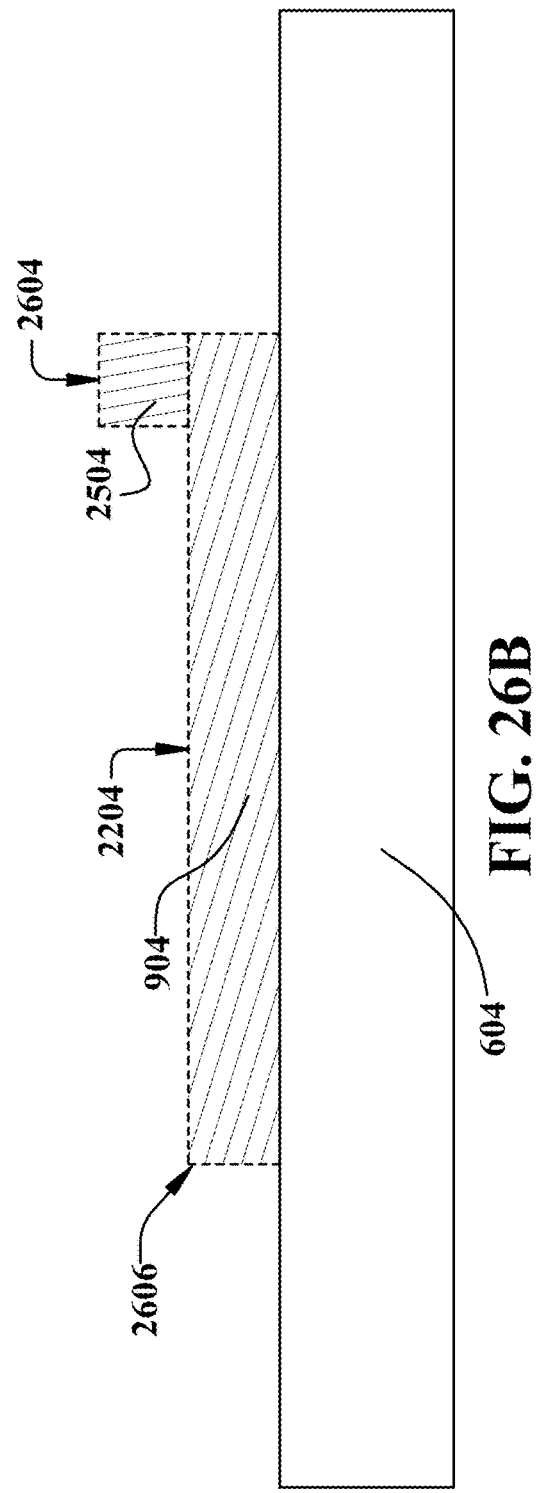

FLUX BIAS LINE LOCAL HEATING DEVICE

BACKGROUND

The subject disclosure relates to superconducting flux bias circuits, and more specifically, to a flux bias line local heating device and a method for forming the same.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, methods, computer-implemented methods, apparatus, and/or computer program products that facilitate local heating of a superconducting flux biasing loop are described.

According to an embodiment, a device can comprise a substrate having a superconducting flux bias circuit comprising a biasing loop coupled to a flux controlled qubit device. The device can further comprise a heating device coupled to the biasing loop. An advantage of such a device is that it can facilitate local heating of the biasing loop (e.g., as opposed to adjusting the temperature of a cryostat comprising the quantum device).

In some embodiments, the heating device is thermally coupled to the biasing loop to control superconductivity of the biasing loop and a magnetic field of the biasing loop. An advantage of such a device is that it can facilitate at least one of improved fidelity of the flux controlled qubit device, improved fidelity of a quantum device comprising the flux controlled qubit device, or improved performance of the quantum device comprising the flux controlled qubit device.

According to an embodiment, a device can comprise a superconducting flux bias circuit comprising a flux controlled qubit device coupled to a biasing loop comprising a first critical temperature material and a second critical temperature material. The device can further comprise a heating device coupled to the biasing loop. An advantage of such a device is that it can facilitate local heating of the biasing loop (e.g., as opposed to adjusting the temperature of a cryostat comprising the quantum device).

In some embodiments, the heating device is thermally coupled to the biasing loop to heat the second critical temperature material above a critical temperature of the second critical temperature material. An advantage of such a device is that it can facilitate local heating of the biasing loop (e.g., as opposed to adjusting the temperature of a cryostat comprising the quantum device).

According to an embodiment, a device can comprise a substrate having superconducting flux bias circuits comprising biasing loops coupled to flux controlled qubit devices. The device can further comprise one or more heating devices coupled to one or more of the biasing loops and one or more control circuit wires formed on the substrate. An advantage of such a device is that it can facilitate local, individual, and/or simultaneous heating of one or more of the biasing loops (e.g., as opposed to adjusting the temperature of a cryostat comprising the quantum device).

In some embodiments, at least one of the one or more heating devices is thermally coupled to at least one biasing loop of the biasing loops to control superconductivity and magnetic fields of the at least one biasing loop. An advantage of such a device is that it can facilitate at least one of improved fidelity of at least one flux controlled qubit device of the flux controlled qubit devices, improved fidelity of a quantum device comprising the at least one flux controlled qubit device, or improved performance of the quantum device comprising the at least one flux controlled qubit device.

DESCRIPTION OF THE DRAWINGS

FIGS. 6A and 6B illustrate a top view and a cross-sectional view, respectively, of an example, non-limiting device comprising a substrate in accordance with one or more embodiments described herein.

FIGS. 8A and 8B illustrate a top view and a cross-sectional view, respectively, of the example, non-limiting device of FIGS. 7A and 7B after removing a portion of the resist layer in accordance with one or more embodiments described herein.

FIGS. 9A and 9B illustrate a top view and a cross-sectional view, respectively, of the example, non-limiting device of FIGS. 8A and 8B after depositing a first superconducting layer in accordance with one or more embodiments described herein.

FIGS. 11A and 11B illustrate a top view and a cross-sectional view, respectively, of the example, non-limiting device of FIGS. 10A and 10B after depositing an insulating layer in accordance with one or more embodiments described herein.

FIGS. 13A and 13B illustrate a top view and a cross-sectional view, respectively, of the example, non-limiting device of FIGS. 12A and 12B after removing a portion the resist layer in accordance with one or more embodiments described herein.

FIGS. 14A and 14B illustrate a top view and a cross-sectional view, respectively, of the example, non-limiting device of FIGS. 13A and 13B after depositing a resistive layer in accordance with one or more embodiments described herein.

FIGS. 17A and 17B illustrate a top view and a cross-sectional view, respectively, of the example, non-limiting device of FIGS. 16A and 16B after removing portions of the resist layer in accordance with one or more embodiments described herein.

FIGS. 19A and 19B illustrate a top view and a cross-sectional view, respectively, of the example, non-limiting device of FIGS. 18A and 18B after removing the resist layer and portions of the second superconducting layer to form superconducting heater bias wires in accordance with one or more embodiments described herein.

FIGS. 20A and 20B illustrate a top view and a cross-sectional view, respectively, of the example, non-limiting device of FIGS. 7A and 7B after removing a portion the resist layer in accordance with one or more embodiments described herein.

FIGS. 21A and 21B illustrate a top view and a cross-sectional view, respectively, of the example, non-limiting device of FIGS. 20A and 20B after depositing a first superconducting layer in accordance with one or more embodiments described herein.

FIGS. 22A and 22B illustrate a top view and a cross-sectional view, respectively, of the example, non-limiting device of FIGS. 21A and 21B after removing the resist layer and portions of the first superconducting layer to form a first superconducting material of a biasing loop on the substrate in accordance with one or more embodiments described herein.

FIGS. 23A and 23B illustrate a top view and a cross-sectional view, respectively, of the example, non-limiting device of FIGS. 22A and 22B after forming a resist layer on the first superconducting material and the substrate in accordance with one or more embodiments described herein.

FIGS. 24A and 24B illustrate a top view and a cross-sectional view, respectively, of the example, non-limiting device of FIGS. 23A and 23B after removing a portion of the resist layer in accordance with one or more embodiments described herein.

FIGS. 25A and 25B illustrate a top view and a cross-sectional view, respectively, of the example, non-limiting device of FIGS. 24A and 24B after depositing a second superconducting layer in accordance with one or more embodiments described herein.

FIGS. 26A and 26B illustrate a top view and a cross-sectional view, respectively, of the example, non-limiting device of FIGS. 25A and 25B after removing the resist layer and portions of the second superconducting layer to form a second superconducting material of a biasing loop formed on the substrate in accordance with one or more embodiments described herein.

DETAILED DESCRIPTION

Figure 1:
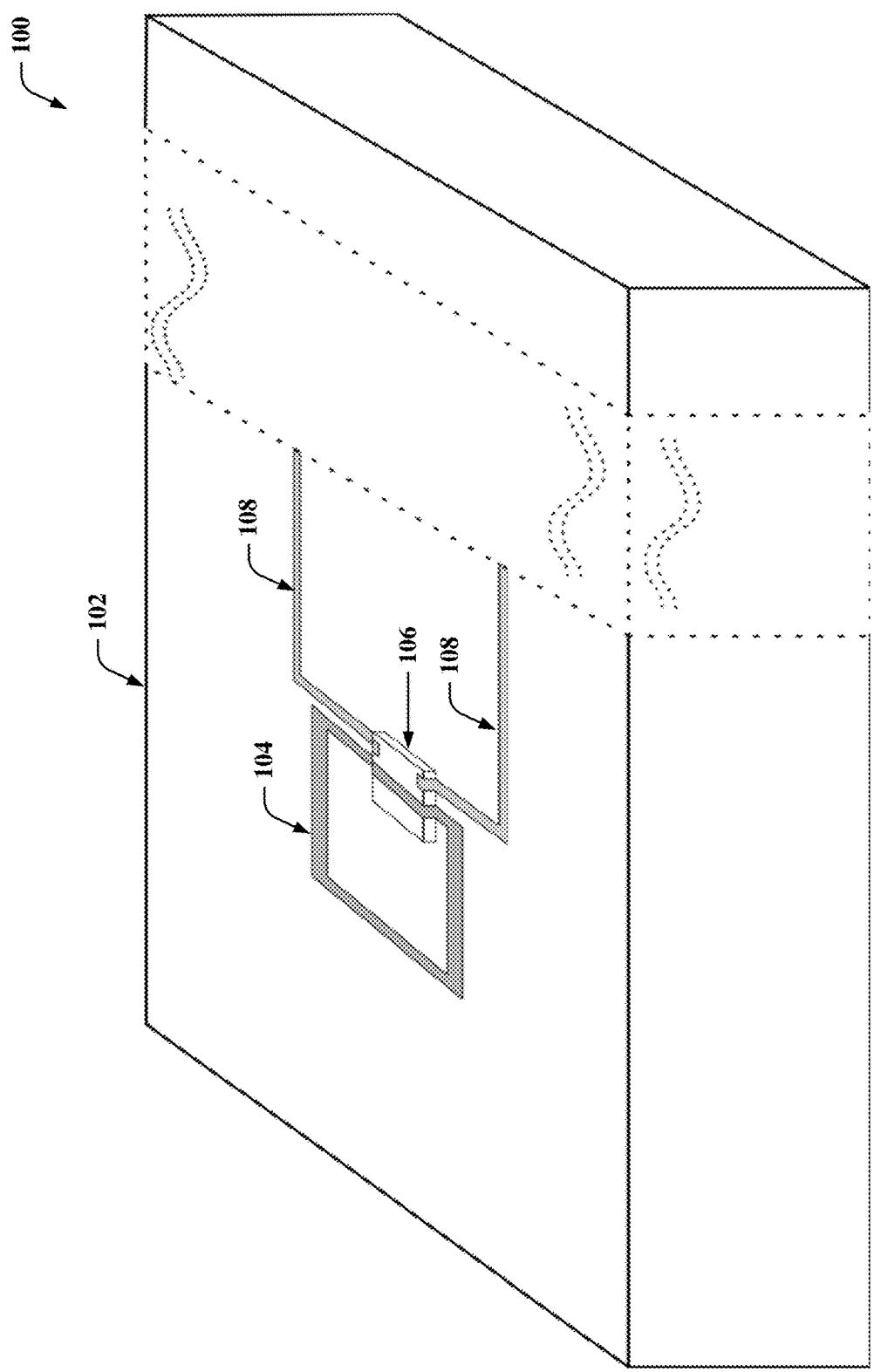
FIGS. 1 and 2 illustrate orthogonal views of example, non-limiting devices that can facilitate local heating of a superconducting flux biasing loop in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

Some prior art technologies that can be implemented to adjust a locked bias (e.g., a locked magnetic field) in a superconducting biasing loop of a superconducting flux bias circuit in a quantum device utilize the following method: a) raising the temperature of a cryostat comprising the quantum device to a temperature that is above a critical temperature (e.g., the temperature below which a material behaves as a superconductor) of the material of the biasing loop; b) temporarily making the biasing loop normal (e.g., non-superconducting); c) changing an applied magnetic field to the biasing loop and adjusting the flux bias for a target superconducting quantum interference device loop (SQUID loop) coupled to the biasing loop, where the SQUID loop has a critical temperature that is higher than that of the biasing loop and thus is still superconducting; d) lowering the cryostat temperature and removing the applied magnetic field and thus locking the new flux in the SQUID loop.

A problem with such prior art technologies and/or the method described above is that the temperature of the entire cryostat is adjusted, so if multiple biasing loops or other circuitry are present, they all will have to move to the higher temperature, which limits control locality in a quantum system with many qubits (e.g., limits individual and/or simultaneous control of multiple qubits in a quantum device such as, for instance, a quantum processor). Another problem with such prior art technologies and/or the method described above is that they do not provide for local heating of one or more of such biasing loops described above to enable individual and/or simultaneous control of one or more SQUID loops, qubits, and/or another type of flux controlled qubit device coupled to the biasing loop(s). Another problem with such prior art technologies and/or the method described above is that the temperature change also consumes time and/or energy for settling the temperature between high and low values when the temperature of the entire cryostat is adjusted.

Given the problems described above with prior art technologies, the present disclosure can be implemented to produce a solution to these problems in the form of devices, systems, and/or methods (e.g., computer-implemented methods, fabrication methods, etc.) that can facilitate heating of a superconducting flux biasing loop coupled to a flux controlled qubit device (e.g., a qubit, a SQUID loop, etc.) in a quantum device (e.g., a quantum processor). An advantage of such devices, systems, and/or methods is that they can facilitate local heating of the superconducting flux biasing loop (e.g., as opposed to adjusting the temperature of a cryostat comprising the quantum device).

In some embodiments, the present disclosure can be implemented to produce a solution to the problems described above in the form of devices, systems, and/or methods (e.g., computer-implemented methods, fabrication methods, etc.) that can facilitate local, individual, and/or simultaneous heating of one or more superconducting flux biasing loops coupled to one or more flux controlled qubit devices (e.g., a qubit, a SQUID loop, etc.) in a quantum device (e.g., a quantum processor) to control the one or more flux controlled qubit devices. An advantage of such devices, systems, and/or methods is that they can facilitate at least one of improved fidelity of the flux controlled qubit device(s), improved fidelity of the quantum device comprising the flux controlled qubit device(s), or improved performance of the quantum device comprising the flux controlled qubit device(s).

One or more embodiments of the subject disclosure are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. It is noted that the drawings of the present application are provided for illustrative purposes only and, as such, the drawings are not drawn to scale.

It will be understood that when an element as a layer (also referred to as a film), region, and/or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present. It will also be understood that when an element is referred to as being "coupled" to another element, it can describe one or more different types of coupling including, but not limited to, chemical coupling, communicative coupling, electrical coupling, electromagnetic coupling, operative coupling, optical coupling, physical coupling, thermal coupling, and/or another type of coupling.

FIG. 1 illustrates an orthogonal view of an example, non-limiting device 100 that can facilitate local heating of a superconducting flux biasing loop in accordance with one or more embodiments described herein. Device 100 can comprise a semiconducting and superconducting device that can be implemented in a quantum device. For example, device 100 can comprise an integrated semiconducting and superconducting circuit (e.g., a quantum circuit) that can be implemented in a quantum device such as, for instance, quantum hardware, a quantum processor, a quantum computer, and/or another quantum device.

Device 100 can comprise a substrate 102. Substrate 102 can comprise any material having semiconductor properties including, but not limited to, silicon (Si), sapphire (e.g., aluminum oxide ($Al_2O_3$)), silicon-germanium (SiGe), silicon-germanium-carbon (SiGeC), silicon carbide (SiC), germanium (Ge) alloys, III/V compound semiconductors, II/VI compound semiconductors, and/or another material. In some embodiments, substrate 102 can comprise a layered semiconductor including, but not limited to, silicon/silicon-germanium (Si/SiGe), silicon/silicon carbide (Si/SiC), silicon-on-insulators (SOIs), silicon germanium-on-insulators (SGOIs), and/or another layered semiconductor.

Substrate 102 can have a superconducting flux bias circuit formed thereon and/or therein (e.g., integrated on and/or in substrate 102). The superconducting flux bias circuit can comprise a biasing loop 104. Biasing loop 104 can comprise a persistent flux bias loop that can be coupled (e.g., chemically, communicatively, electrically, electromagnetically, operatively, optically, physically, thermally, etc.) to a flux controlled qubit device (not illustrated in the FIG. 1). The flux controlled qubit device can comprise a qubit, a superconducting quantum interference device loop (SQUID loop), and/or another flux controlled qubit device. Although not illustrated in FIG. 1, the flux controlled qubit device (e.g., a qubit, a SQUID loop, etc.) can be positioned within a close proximity of biasing loop 104. For example, in an embodiment where biasing loop 104 is formed on a surface of substrate 102 (e.g., as illustrated in FIG. 1) the flux controlled qubit device can be integrated into substrate 102. In another example, the flux controlled qubit device can be formed on a surface of substrate 102 that is opposite the surface on which biasing loop 104 is formed. For instance, the flux controlled qubit device can be formed on a bottom surface of substrate 102 in an embodiment where biasing loop 104 is formed on a top surface of substrate 102 (or vice versa in another embodiment).

The flux controlled qubit device (e.g., a qubit, a SQUID loop, etc.) can comprise one or more materials having superconducting properties. The flux controlled qubit device can be formed using one or more materials having respective critical temperatures (e.g., the temperature below which the material behaves as a superconductor).

Biasing loop 104 can comprise any material having superconducting properties including, but not limited to, Aluminum (Al), Titanium Nitride (TiN), Lanthanum (La), Molybdenum (Mo), Molybdenum Nitride (MoN), Tantalum (Ta), Tantalum Nitride (TaN), and/or another material. Biasing loop 104 can be formed using one or more materials having respective critical temperatures. In some embodiments, biasing loop 104 can be formed using a single material having a certain critical temperature. In some embodiments, biasing loop 104 can be formed using multiple materials having different respective critical temperatures. For example, biasing loop 104 can comprise a first critical temperature material comprising a first superconducting material having a first critical temperature and a second critical temperature material comprising a second superconducting material having a second critical temperature that is lower than the first critical temperature (e.g., as described below with reference to biasing loop 304e of device 300e depicted in FIG. 3). Biasing loop 104 can be formed using at least one material having a critical temperature that is lower than that of any material used to form the flux controlled qubit device described above.

Biasing loop 104 can be coupled (e.g., chemically, communicatively, electrically, electromagnetically, operatively, optically, physically, thermally, etc.) to a heating device formed on and/or in substrate 102 (e.g., integrated on and/or in substrate 102). The heating device can comprise a resistive material 106 coupled (e.g., chemically, communicatively, electrically, electromagnetically, operatively, optically, physically, thermally, etc.) to one or more superconducting heater bias wires 108.

Resistive material 106 can comprise any material having resistive properties (e.g., non-superconducting properties) including, but not limited to, nichrome (NiCr), gold-palladium (AuPd), manganese (Mn), constantan (e.g., a copper-nickel alloy), and/or another resistive material (e.g., another normal metal).

Superconducting heater bias wires 108 can comprise any material having superconducting properties including, but not limited to, Niobium (Nb), Niobium Nitride (NbN), Niobium Titanium Nitride (NbTiN), Niobium Titanium (NbTi), Niobium-Germanium (Nb$_3$Ge), and/or another material. Superconducting heater bias wires 108 can comprise a material having a critical temperature that is higher than a critical temperature of the one or more materials used to form biasing loop 104. For example, in embodiments where biasing loop 104 is formed using a single superconducting material having a certain critical temperature, superconducting heater bias wires 108 can be formed using a material having a critical temperature that is higher than that of the single superconducting material used to form biasing loop 104. In another example, in embodiments where biasing loop 104 is formed using a first superconducting material having a first critical temperature and a second superconducting material having a second critical temperature that is lower than the first critical temperature of the first superconducting material, superconducting heater bias wires 108 can be formed using a material having a critical temperature that is higher than the first critical temperature of the first superconducting material and/or higher than the second critical temperature of the second superconducting material. Superconducting heater bias wires 108 can comprise such a higher critical temperature as described above to minimize heat transport away from the heating device (e.g., away from resistive material 106 and/or superconducting heater bias wires 108).

The heating device (e.g., comprising resistive material 106 and superconducting heater bias wires 108) can comprise and/or be implemented as a resistor that can be thermally coupled to biasing loop 104 to locally heat one or more sections of biasing loop 104 (e.g., one or more materials of biasing loop 104). In some embodiments, the heating device can be physically coupled to biasing loop 104. For example, as illustrated in FIG. 1, resistive material 106 of the heating device can be physically coupled biasing loop 104. In some embodiments, the heating device is not physically coupled to biasing loop 104 but instead is positioned within a close proximity of biasing loop 104 (e.g., under, over, inside, partially overlapping, fully overlapping, etc.) so as to enable thermal coupling of the heating device to biasing loop 104. For example, resistive material 106 of the heating device can be positioned within a close proximity of biasing loop 104 so as to enable thermal coupling of resistive material 106 to biasing loop 104.

As described below, the heating device can be thermally coupled to biasing loop 104 to locally heat at least one segment of biasing loop 104 above a critical temperature of biasing loop 104 (e.g., above a critical temperature of one or more materials used to form biasing loop 104 as described above). Additionally, or alternatively, as described below, the heating device can be thermally coupled to biasing loop 104 to control superconductivity of biasing loop 104 and/or a magnetic field of biasing loop 104.

In an example, to locally heat biasing loop 104, superconducting heater bias wires 108 can be coupled (e.g., chemically, communicatively, electrically, electromagnetically, operatively, optically, physically, thermally, etc.) to an electrical power source that can be external to device 100 (e.g., an electrical voltage source and/or an electrical current source, not illustrated in the figures). In this example, such an electrical power source can be employed to apply an electrical current to superconducting heater bias wires 108 that can pass through resistive material 106, thereby heating resistive material 106 and biasing loop 104, which can be physically and/or thermally coupled to resistive material 106 as described above. In this example, resistive material 106 and/or one or more materials used to form biasing loop 104 can be heated to a temperature that is higher than a critical temperature of such one or materials used to form biasing loop 104. Based on such heating of biasing loop 104 to a temperature that is higher than a critical temperature of one or more materials of biasing loop 104, such one or more materials used to form biasing loop 104 can become normal (e.g., non-superconducting) for a certain amount of time. By causing such one or more materials of biasing loop 104 to become normal (e.g., non-superconducting), an electrical current circulating in biasing loop 104 and/or a magnetic field of biasing loop 104 (e.g., a magnetic field applied to biasing loop 104) can decay due to dissipation in the normal section of biasing loop 104. Based on such decay of the circulating current and/or magnetic field of biasing loop 104, a new magnetic field can be applied to biasing loop 104 (e.g., via a flux bias source external to device 100) and the heating device comprising resistive material 106 and superconducting heater bias wires 108 can be turned off (e.g., by removing the electrical power source described above). Once the heating device is turned off, biasing loop 104 can cool and return to a superconducting state, which can cause the flux (e.g., the newly applied magnetic field) to be permanently trapped in biasing loop 104, and at this time, the external flux bias that can be used to apply the new magnetic field to biasing loop 104 can be removed. The process described above can be implemented to locally heat biasing loop 104 and/or tune the flux controlled qubit device (e.g., to adjust the flux bias for the flux controlled qubit device).

Heat flow from the heating device (e.g., the resistive material 106 and/or superconducting heater bias wires 108) to substrate 102 can depend (e.g., can vary). For example, in an embodiment where substrate 102 comprises sapphire (e.g., aluminum oxide (Al$_2$O$_3$)), thermal conductance of sapphire at 200 millikelvins (mK) can equal 1e-4 watts (0.0001 watts) per centimeter Kelvin (e.g., thermal conductance of sapphire at 200 mK=1e-4 W/cm-K). In this example, power flowing through substrate 102 can be determined using equation (1) defined below:

$$\dot{Q} = \frac{A}{L} \int_{T_1}^{T_2} \kappa(T) dT \qquad (1)$$

where A denotes the area of the sample, L denotes the thickness of the sample, Ti denotes the temperature of the top surface, $T_2$ denotes the temperature of the bottom surface, K denotes the thermal conductivity, and T denotes the temperature integration variable.

In this example, assume the top surface of substrate 102 is at 200 mK and the bottom surface is at 10 mK. In this example, for a 1 millimeter by 1 millimeter (1 mm$^2$) substrate 102, this gives a power flow passing through substrate 102 of approximately Q=3 microwatts (pw). In this example, this can heat a cryostat comprising device 100 to some level. However, in this example, typically at 100 mK the cryostat has a cooling power above 400 µW so a load of 3 µW will only have a minor effect on base temperature. In this example, with a heater resistance of 3 Ohm (e.g., the resistance of resistive material 106), a heater current of 1 milliamp (mA) (e.g., the current flowing through superconducting heater bias wires 108 and/or resistive material 106) would be sufficient to bring the temperature above 200 mK of the heating device. In this example, the Kapitza resistance has not been taken into account. Including the Kapitza resistance in this example would reduce the required heater power to raise the temperature, however the time to cool the sample down again might increase. In this example, utilizing superconducting heater bias wires 108 comprising material having higher critical temperature can be used to feed the heating device (e.g., resistive material 106) without much thermal connection.

Figure 2:
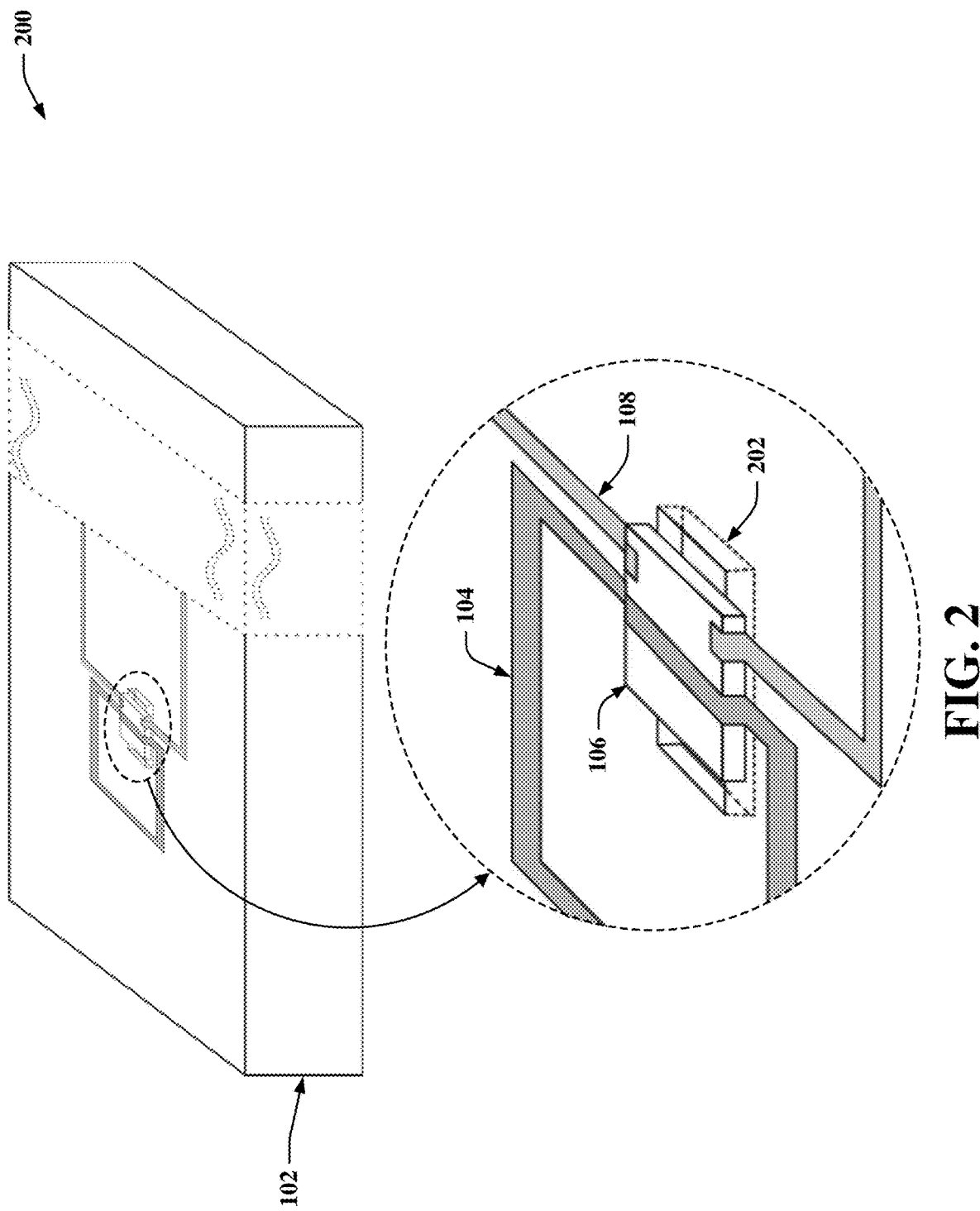

FIG. 2 illustrates an orthogonal view of an example, non-limiting device 200 that can facilitate local heating of a superconducting flux biasing loop in accordance with one or more embodiments described herein. Repetitive description of like elements and/or processes employed in other embodiments described herein is omitted for sake of brevity.

Device 200 can comprise an example, non-limiting alternative embodiment of device 100, where device 200 can comprise a pocket 202 that can be positioned under one or more portions of biasing loop 104, resistive material 106, and/or superconducting heater bias wires 108 as illustrated in the inset view depicted in FIG. 2. Pocket 202 can be etched into substrate 102 during fabrication of device 200 using one or more etching techniques (e.g., reactive ion etching (RIE), dry etching, wet etching, ion beam etching, plasma etching, laser ablation, etc.). Pocket 202 can reduce undesired thermal coupling of one or more components of device 200 (e.g., the flux controlled qubit device, substrate 102, biasing loop 104, resistive material 106, superconducting heater bias wires 108, etc.). By reducing such undesired thermal coupling of one or more components of device 200, pocket 202 can thereby facilitate improved local heating (e.g., relative to device 100) of biasing loop 104 by the heating device comprising resistive material 106 and superconducting heater bias wires 108 as described above.

Figure 3:
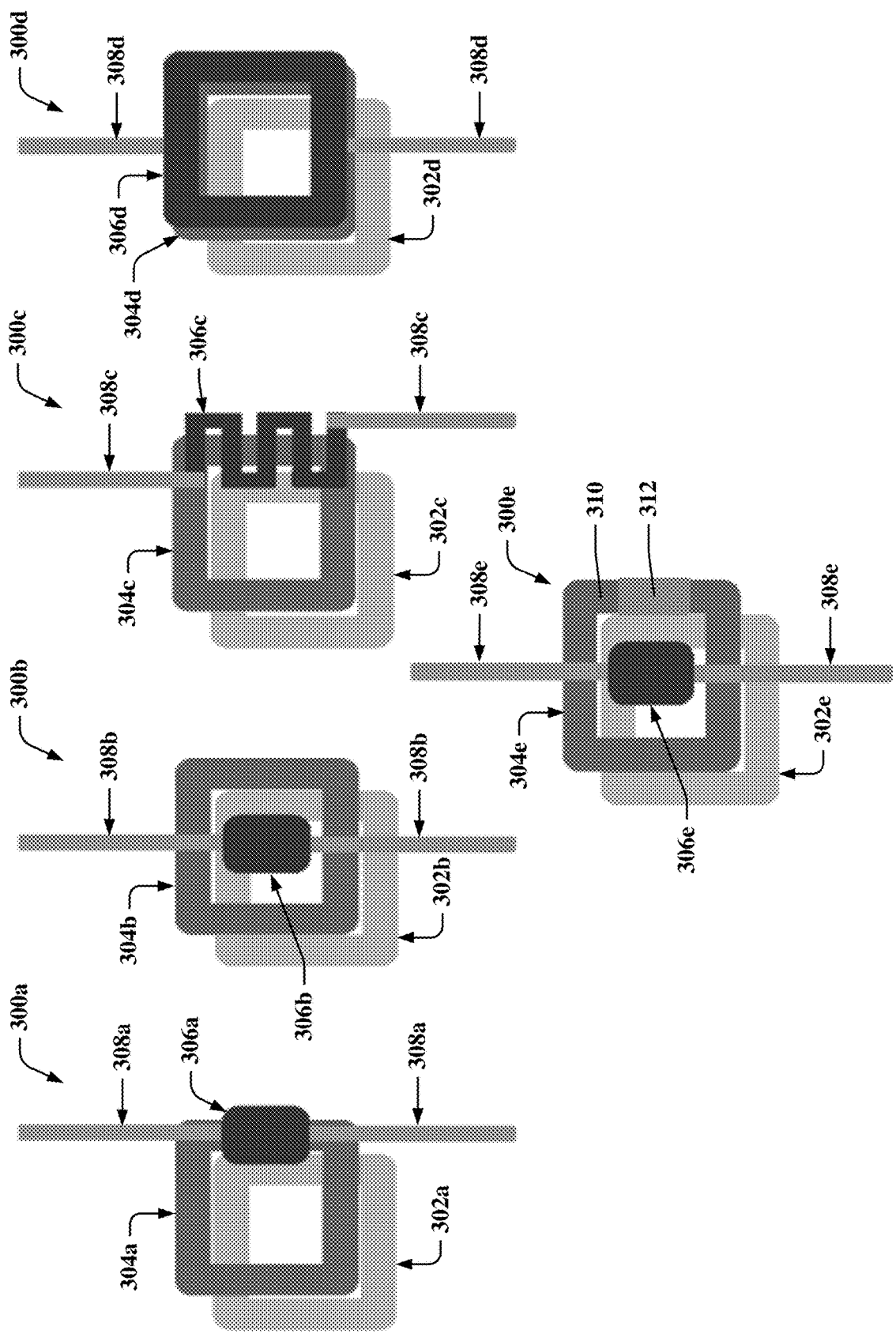
FIG. 3 illustrates top views of example, non-limiting devices that can facilitate local heating of a superconducting flux biasing loop in accordance with one or more embodiments described herein.

FIG. 3 illustrates top views of example, non-limiting devices 300a, 300b, 300c, 300d, 300e that can facilitate local heating of a superconducting flux biasing loop in accordance with one or more embodiments described herein. Repetitive description of like elements and/or processes employed in other embodiments described herein is omitted for sake of brevity.

Devices 300a, 300b, 300c, 300d, 300e can comprise example, non-limiting alternative embodiments of device 100 and/or device 200. Devices 300a, 300b, 300c, 300d, 300e can be formed on and/or in substrate 102 (e.g., integrated on and/or in substrate 102), however, for clarity, substrate 102 is not depicted in the illustrations of devices 300a, 300b, 300c, 300d, 300e shown in FIG. 3.

As illustrated in FIG. 3, devices 300a, 300b, 300c, 300d, 300e can respectively comprise: flux controlled qubit devices 302a, 302b, 302c, 302d, 302e, which can each comprise an embodiment of the flux controlled qubit device (e.g., a qubit, a SQUID loop, etc.) of device 100 and/or device 200 described above with reference to FIGS. 1 and 2; biasing loops 304a, 304b, 304c, 304d, 304e, which can each comprise an example, non-limiting alternative embodiment of biasing loop 104; resistive material 306a, 306b, 306c, 306d, 306e, which can each comprise an example, non-limiting alternative embodiment of resistive material 106; and/or one or more superconducting heater bias wires 308a, 308b, 308c, 308d, 308e, which can each comprise an example, non-limiting alternative embodiment of superconducting heater bias wires 108.

As illustrated in FIG. 3, resistive material 306a, 306b, 306c, 306d, 306e of devices 300a, 300b, 300c, 300d, 300e, respectively, can be formed in a variety of shapes and/or positioned in a variety of locations relative to biasing loops 304a, 304b, 304c, 304d, 304e. For example, as depicted in devices 300a, 300b, resistive material 306a, 306b, 306e can comprise a substantially rectangular shape. In this example, as depicted in device 300a, resistive material 306a can be positioned over a portion of biasing loop 304a, while in devices 300b, 300e, resistive material 306b, 306e can be positioned substantially at the center of biasing loops 304b, 304e, respectively.

In another example, as depicted in device 300c, resistive material 306c can comprise a substantially serpentine shape and can be positioned over a portion of biasing loop 304a. In this example, such a substantially serpentine shape of resistive material 306c can enable higher resistance of resistive material 306c and increased temperature control (e.g., of device 300c, biasing loop 304c, resistive material 306c, superconducting heater bias wires 308c, etc.) when in operation. In another example, as depicted in device 300d, resistive material 306d can comprise a substantially same shape as biasing loop 304d and can be positioned substantially over biasing loop 304d.

In another example, as depicted in device 300e, biasing loop 304e can comprise a first superconducting material 310 and a second superconducting material 312. In this example, first superconducting material 310 can comprise a first superconducting material having a first critical temperature and second superconducting material 312 can comprise a second superconducting material having a second critical temperature, where the second critical temperature of second superconducting material 312 is lower than the first critical temperature of first superconducting material 310. In this example, as depicted in device 300e, first superconducting material 310 and second superconducting material 312 can be positioned in series in biasing loop 304e. In this example, forming biasing loop 304e using first superconducting material 310 and second superconducting material 312 can facilitate faster temperature cycling (e.g., of biasing loop 304e). In this example, as described above with reference to FIG. 1, to locally heat and control superconductivity of biasing loop 304e, an electric power source can be applied to superconducting heater bias wires 308e to heat resistive material 306e and second superconducting material 312 to a temperature that is higher than the second critical temperature described above of second superconducting material 312. In this example, by heating second superconducting material 312 above its critical temperature, biasing loop 304e can become normal (e.g., non-superconducting), thereby enabling application of a new magnetic field in biasing loop 304e and/or tuning of flux controlled qubit device 302e as described above with reference to FIG. 1.

Figure 4:
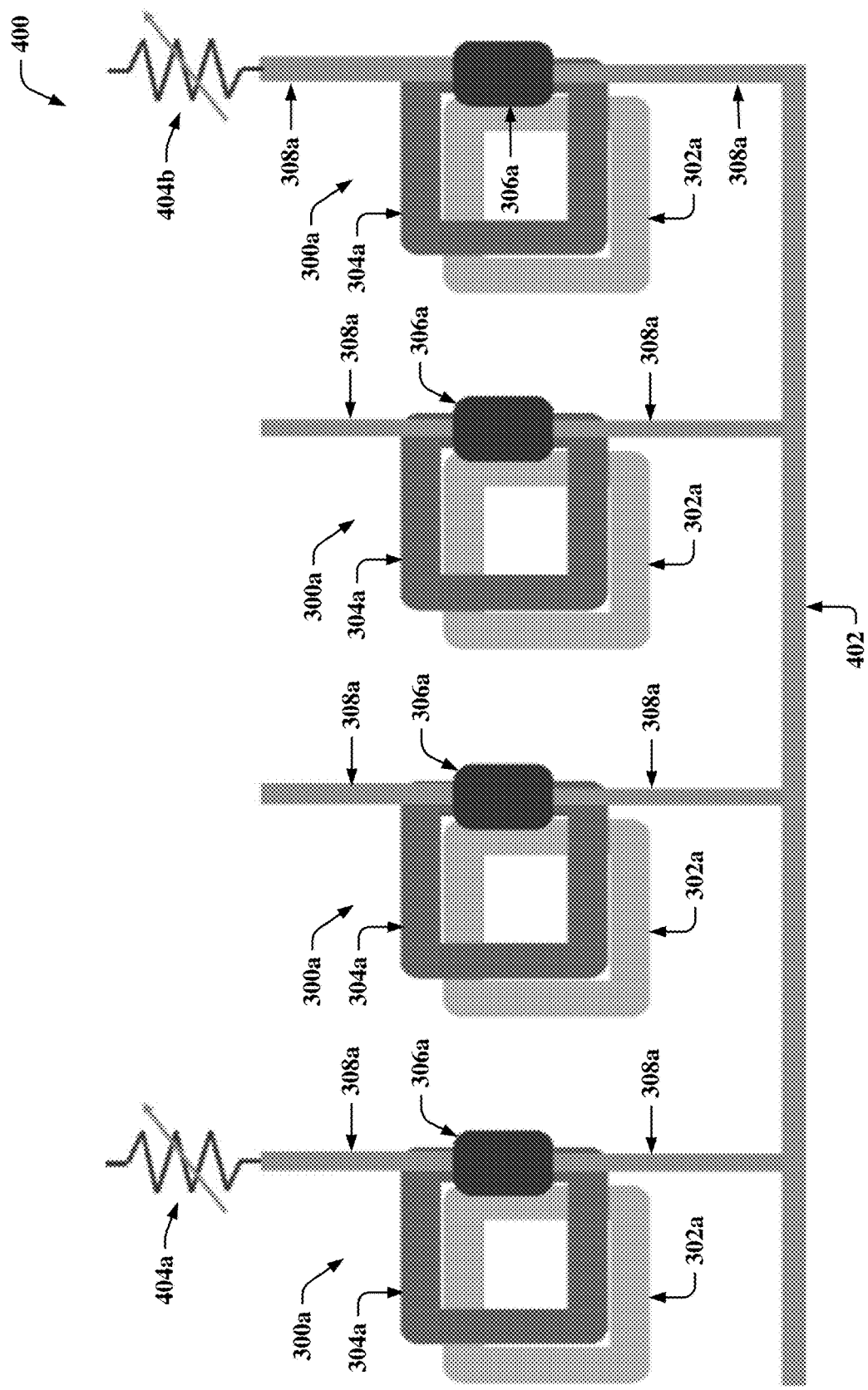
FIGS. 4 and 5 illustrate top views of example, non-limiting systems that can facilitate local heating of a superconducting flux biasing loop in accordance with one or more embodiments described herein.

FIG. 4 illustrates a top view of an example, non-limiting system 400 that can facilitate local heating of a superconducting flux biasing loop in accordance with one or more embodiments described herein. Repetitive description of like elements and/or processes employed in other embodiments described herein is omitted for sake of brevity.

System 400 can comprise one or more devices 300a that can be formed on substrate 102 and can be coupled (e.g., chemically, communicatively, electrically, electromagnetically, operatively, optically, physically, thermally, etc.) to one or more control circuit wires 402 that can be formed on substrate 102. Although system 400 is depicted in FIG. 4 with multiple devices 300a, it should be appreciated that the subject disclosure is not so limiting. For instance, system 400 can comprise one or more of devices 100, 200, 300a, 300b, 300c, 300d, and/or 300e. As illustrated in FIG. 4, in an embodiment, system 400 can comprise multiple devices 300a that can be coupled (e.g., chemically, communicatively, electrically, electromagnetically, operatively, optically, physically, thermally, etc.) to one another in parallel via control circuit wire 402. In an example, control circuit wire 402 depicted in FIG. 4 can comprise a common bias line. Although not depicted in FIG. 4, control circuit wire 402 can be further coupled to other control circuitry components (e.g., components of a control grid external to system 400) that can facilitate operation devices 300a.

System 400 can comprise a control circuit (e.g., a control grid) that can be implemented to operate one or more devices 300a individually and/or simultaneously (e.g., to locally heat and/or control superconductivity of biasing loop(s) 304a individually and/or simultaneously). In some embodiments, system 400 can comprise one or more tunable resistors 404a, 404b that can be coupled (e.g., chemically, communicatively, electrically, electromagnetically, operatively, optically, physically, thermally, etc.) to one or more devices 300a to control operation of such device(s) 300a individually and/or simultaneously (e.g., via individually and/or simultaneously adjusting electrical current to resistive material(s) 306a of device(s) 300a to locally heat and/or control superconductivity of biasing loop(s) 304a individually and/or simultaneously). Although not depicted in FIG. 4, one or more of tunable resistors 404a, 404b can be further coupled to other control circuitry components (e.g., components of a control grid external to system 400) that can facilitate operation devices 300a. In some embodiments, one or more of tunable resistors 404a, 404b can be formed on and/or in substrate 102 (e.g., integrated on and/or in substrate 102) or be positioned in a location external to substrate 102.

Figure 5:
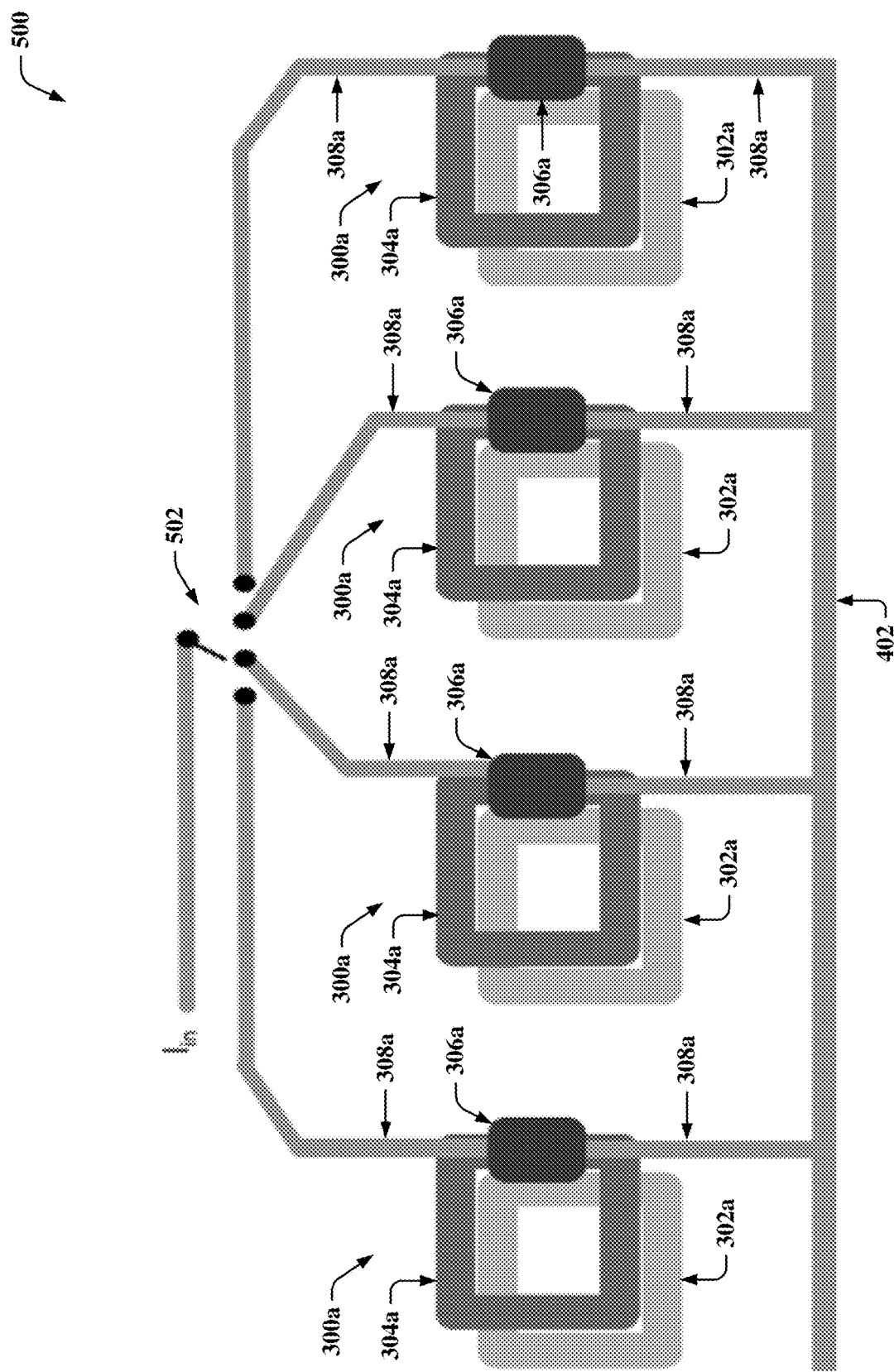

FIG. 5 illustrates a top view of an example, non-limiting system 500 that can facilitate local heating of a superconducting flux biasing loop in accordance with one or more embodiments described herein. Repetitive description of like elements and/or processes employed in other embodiments described herein is omitted for sake of brevity.

System 500 can comprise an example, non-limiting alternative embodiment of system 400, where system 500 can comprise a switch 502 that can be coupled (e.g., chemically, communicatively, electrically, electromagnetically, operatively, optically, physically, thermally, etc.) to one or more superconducting heater bias wires 308a of one or more devices 300a as illustrated in FIG. 5 to control operation of such device(s) 300a. Although not depicted in FIG. 5, switch 502 can be further coupled (e.g., chemically, communicatively, electrically, electromagnetically, operatively, optically, physically, thermally, etc.) to other control circuitry components (e.g., components of a control grid external to system 500) that can facilitate operation devices 300a.

In an example, switch 502 can be actuated (e.g., via an electrical power source external to system 500) to facilitate coupling (e.g., chemically, communicatively, electrically, electromagnetically, operatively, optically, physically, thermally, etc.) switch 502 to one or more superconducting heater bias wires 308a of one or more devices 300a to control operation of such device(s) 300a individually and/or simultaneously (e.g., via individually and/or simultaneously adjusting electrical current to resistive material(s) 306a of device(s) 300a to locally heat and/or control superconductivity of biasing loop(s) 304a individually and/or simultaneously). In some embodiments, switch 502 can be formed on and/or in substrate 102 (e.g., integrated on and/or in substrate 102) or be positioned in a location external to substrate 102.

FIGS. 6A-26B illustrate example, non-limiting multi-step fabrication sequences that can be implemented to fabricate one or more embodiments of the subject disclosure described herein and/or illustrated in the figures. For example, the non-limiting multi-step fabrication sequence illustrated in FIGS. 6A-19B can be implemented to fabricate device 1900, where device 1900 can comprise an example, non-limiting alternative embodiment of device 100, 200, 300a, 300b, 300c, 300d, 400, and/or 500 described above with reference to FIGS. 1-5. In another example, the non-limiting multi-step fabrication sequence illustrated in FIGS. 20A-26B can be implemented to fabricate device 2600, where device 2600 can comprise an example, non-limiting alternative embodiment of device 300e described above with reference to FIG. 3.

Although the non-limiting multi-step fabrication sequences illustrated in FIGS. 6A-26B describe fabrication of devices 1900 and 2600, it should be appreciated that the subject disclosure is not so limiting. For example, the non-limiting multi-step fabrication sequences illustrated in FIGS. 6A-26B can be modified accordingly and implemented to fabricate device 100, 200, 300a, 300b, 300c, 300d, 300e, 400, and/or 500 described above with reference to FIGS. 1-5.

As described below with reference to FIGS. 6A-26B, fabrication of the various embodiments of the subject disclosure described herein and/or illustrated in the figures (e.g., device 100, 200, 300a, 300b, 300c, 300d, 300e, 1900, 2600, system 400, 500, etc.) can comprise multi-step sequences of, for example, photolithographic and/or chemical processing steps that facilitate gradual creation of electronic-based systems, devices, components, and/or circuits in a semiconducting and superconducting device (e.g., an integrated circuit). For instance, the various embodiments of the subject disclosure described herein and/or illustrated in the figures (e.g., device 100, 200, 300a, 300b, 300c, 300d, 300e, 1900, 2600, system 400, 500, etc.) can be fabricated by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, etc.), etching techniques (e.g., reactive ion etching (RIE), dry etching, wet etching, ion beam etching, plasma etching, laser ablation, etc.), evaporation techniques, sputtering techniques, plasma ashing techniques, thermal treatments (e.g., rapid thermal anneal, furnace anneals, thermal oxidation, etc.), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit.

As described below with reference to FIGS. 6A-26B, the various embodiments of the subject disclosure described herein and/or illustrated in the figures (e.g., device 100, 200, 300a, 300b, 300c, 300d, 300e, 1900, 2600, system 400, 500, etc.) can be fabricated using various materials. For example, the various embodiments of the subject disclosure described herein and/or illustrated in the figures (e.g., device 100, 200, 300a, 300b, 300c, 300d, 300e, 1900, 2600, system 400, 500, etc.) can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit.

FIG. 6A illustrates a top view of an example, non-limiting device 600 comprising a substrate in accordance with one or more embodiments described herein. FIG. 6B illustrates a cross-sectional side view of device 600 as viewed along a plane defined by line 602. Repetitive description of like elements and/or processes employed in other embodiments described herein is omitted for sake of brevity.

Device 600 can comprise a substrate 604. Substrate 604 can comprise substrate 102. For example, substrate 604 can comprise the same material as that of substrate 102 (e.g., silicon (Si), sapphire (e.g., aluminum oxide ($Al_2O_3$)), silicon-germanium (SiGe), silicon-germanium-carbon (SiGeC), silicon carbide (SiC), germanium (Ge) alloys, III/V compound semiconductors, II/VI compound semiconductors, silicon/silicon-germanium (Si/SiGe), silicon/silicon carbide (Si/SiC), silicon-on-insulators (SOIs), silicon germanium-on-insulators (SGOIs), etc.). Substrate 604 can comprise a thickness (e.g., height) ranging from approximately 50 micrometers (μm) to approximately 800 μm. In some embodiments, one or more sides of substrate 604 (e.g., top side, bottom side, etc.) can be polished (e.g., using chemical-mechanical planarization (CMP), backgrinding technique, etc.).

Figure 7A:
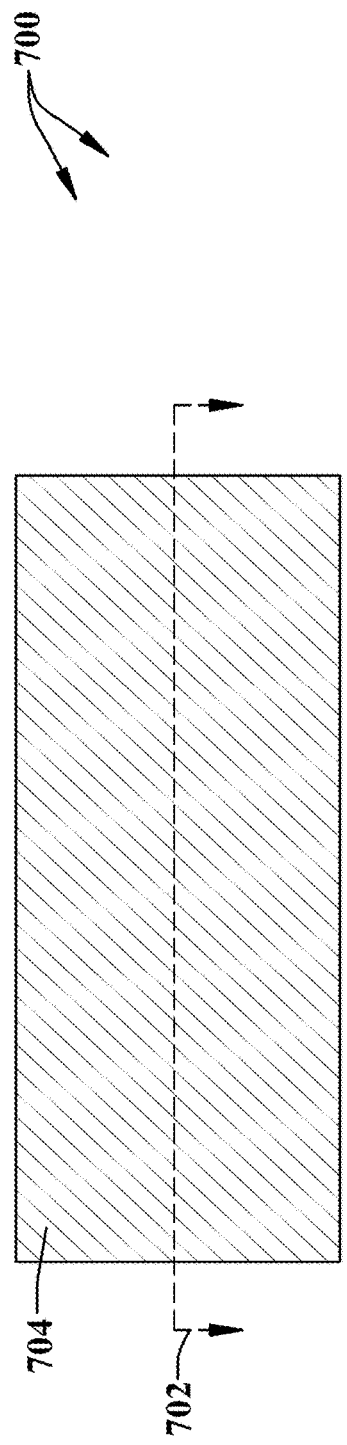
FIGS. 7A and 7B illustrate a top view and a cross-sectional view, respectively, of the example, non-limiting device of FIGS. 6A and 6B after forming a resist layer on the substrate in accordance with one or more embodiments described herein.
Figure 7B:
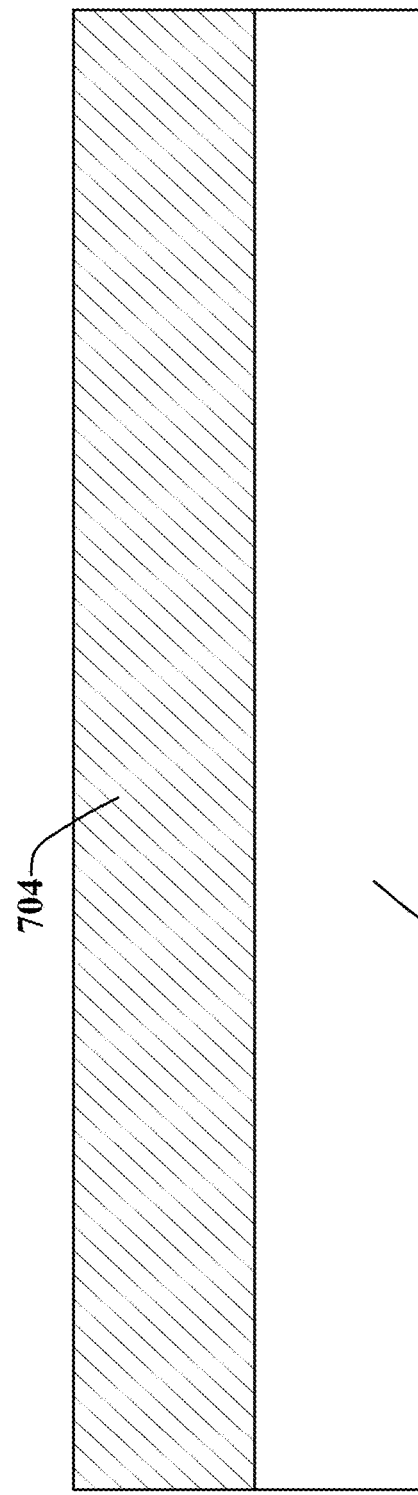

FIG. 7A illustrates a top view of the example, non-limiting device 600 of FIGS. 6A and 6B after forming a resist layer on the substrate in accordance with one or more embodiments described herein. FIG. 7B illustrates a cross-sectional side view of device 700 as viewed along a plane defined by line 702. Repetitive description of like elements and/or processes employed in other embodiments described herein is omitted for sake of brevity.

Device 700 can comprise an example, non-limiting alternative embodiment of device 600 after formation of a resist layer 704 on substrate 604 as illustrated in FIGS. 7A and 7B. Resist layer 704 can comprise a photoresist material that can be formed on substrate 604 using one or more photolithography, patterning, and/or photoresist techniques defined above (e.g., a lithographic patterning process). In an example, resist layer 704 can be deposited onto substrate 604 using a spin coating technique. Resist layer 704 can comprise a photoresist including, but not limited to, a positive-tone photoresist, a negative-tone photoresist, a hybrid-tone photoresist, and/or another photoresist.

FIG. 8A illustrates a top view of the example, non-limiting device 700 of FIGS. 7A and 7B after removing a portion of the resist layer in accordance with one or more embodiments described herein. FIG. 8B illustrates a cross-sectional side view of device 800 as viewed along a plane defined by line 802. Repetitive description of like elements and/or processes employed in other embodiments described herein is omitted for sake of brevity.

Device 800 can comprise an example, non-limiting alternative embodiment of device 700 after removing a portion of resist layer 704 from substrate 604 to form void 804 as illustrated in FIGS. 8A and 8B. Void 804 can be formed in resist layer 704 by removing a portion of resist layer 704 using one or more photolithography, patterning, and/or photoresist techniques defined above (e.g., a lithographic patterning process). In an example (not illustrated in the figures), resist layer 704 and/or void 804 can be formed using an ion milling process to form a reverse profile of resist layer 704 and/or void 804 on substrate 604. Although void 804 depicted in FIGS. 8A and 8B comprises a substantially rectangular ring shape, it should be appreciated that the subject disclosure is not so limiting. For example, void 804 can be formed in any shape (e.g., a circular ring, a square ring, a triangular ring, etc.) that can enable fabrication and/or implementation of one or more embodiments of the subject disclosure that can facilitate local heating of a superconducting flux biasing loop as described herein (e.g., device 100, 200, 300a, 300b, 300c, 300d, 300e, 1900, 2600, system 400, 500, etc.).

FIG. 9A illustrates a top view of the example, non-limiting device 800 of FIGS. 8A and 8B after depositing a first superconducting layer in accordance with one or more embodiments described herein. FIG. 9B illustrates a cross-sectional side view of device 900 as viewed along a plane defined by line 902. Repetitive description of like elements and/or processes employed in other embodiments described herein is omitted for sake of brevity.

Device 900 can comprise an example, non-limiting alternative embodiment of device 800 after depositing a superconducting layer 904 on device 800 as illustrated in FIGS. 9A and 9B (e.g., onto resist layer 704 and onto the exposed surface of substrate 604 in void 804). Superconducting layer 904 can be deposited on device 800 (e.g., onto resist layer 704 and onto the exposed surface of substrate 604 in void 804) using one or more material deposition techniques defined above (e.g., evaporation techniques, sputtering techniques, chemical vapor deposition (CVD), atomic layer deposition (ALD), physical vapor deposition (PVD), molecular beam epitaxy (MBE), electrochemical deposition (ECD), etc.). Superconducting layer 904 can be formed using a superconducting material including, but not limited to, Aluminum (Al), Titanium Nitride (TiN), Lanthanum (La), Molybdenum (Mo), Molybdenum Nitride (MoN), Tantalum (Ta), Tantalum Nitride (TaN), and/or another material. Superconducting layer 904 can comprise a thickness (e.g., height) ranging from approximately 30 nanometers (nm) to approximately 500 nm. Superconducting layer 904 can be deposited on device 800 as illustrated in FIGS. 9A and 9B to form a biasing loop such as, for instance, biasing loop 1004 as described below and illustrated in FIGS. 10A and 10B.

Figure 10A:
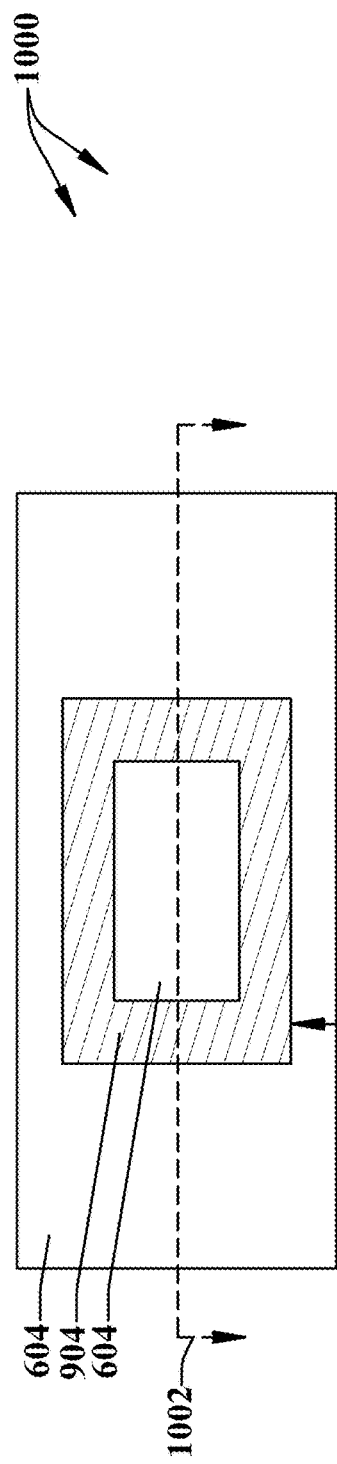
FIGS. 10A and 10B illustrate a top view and a cross-sectional view, respectively, of the example, non-limiting device of FIGS. 9A and 9B after removing the resist layer and portions of the first superconducting layer to form a biasing loop on the substrate in accordance with one or more embodiments described herein.
Figure 10B:
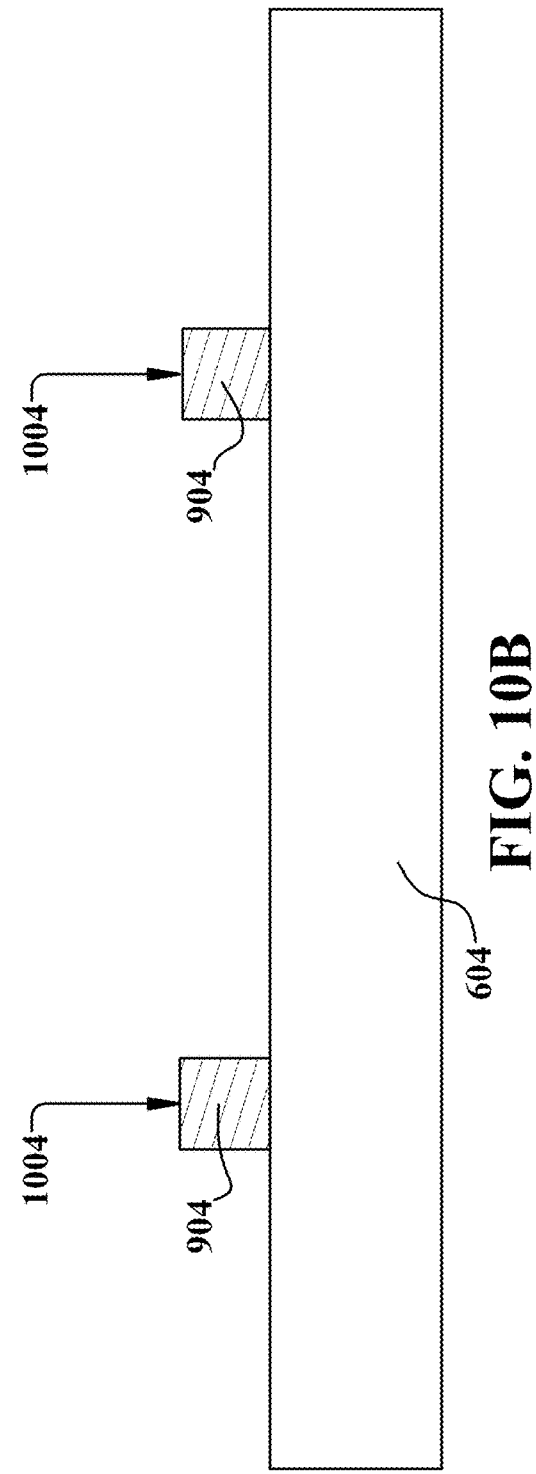

FIG. 10A illustrates a top view of the example, non-limiting device 900 of FIGS. 9A and 9B after removing the resist layer and portions of the first superconducting layer to form a biasing loop on the substrate in accordance with one or more embodiments described herein. FIG. 10B illustrates a cross-sectional side view of device 1000 as viewed along a plane defined by line 1002. Repetitive description of like elements and/or processes employed in other embodiments described herein is omitted for sake of brevity.

Device 1000 can comprise an example, non-limiting alternative embodiment of device 900 after removing resist layer 704 and the portions of superconducting layer 904 deposited on resist layer 704 to form a biasing loop 1004 as illustrated in FIGS. 10A and 10B. Resist layer 704 and the portions of superconducting layer 904 deposited on resist layer 704 can be removed using a lift off technique (e.g., washing with a solvent, stripping, etc.) to form biasing loop 1004 on substrate 604 as illustrated in FIGS. 10A and 10B. Biasing loop 1004 can comprise the portion of superconducting layer 904 remaining on substrate 604 after removing resist layer 704 and the portions of superconducting layer 904 deposited on resist layer 704 as described above. In an example, biasing loop 1004 can comprise an example, non-limiting alternative embodiment of biasing loop 104 described above and illustrated in FIGS. 1 and 2. In another example, biasing loop 1004 can comprise an example, non-limiting embodiment of biasing loop 304a, 304b, 304c, 304d, and/or 304e described above and illustrated in FIGS. 3, 4, and 5.

FIG. 11A illustrates a top view of the example, non-limiting device 1000 of FIGS. 10A and 10B after depositing an insulating layer in accordance with one or more embodiments described herein. FIG. 11B illustrates a cross-sectional side view of device 1100 as viewed along a plane defined by line 1102. Repetitive description of like elements and/or processes employed in other embodiments described herein is omitted for sake of brevity.

Device 1100 can comprise an example, non-limiting alternative embodiment of device 1000 after depositing insulating layer 1104 on device 1000 as illustrated in FIGS. 11A and 11B (e.g., onto substrate 604 and biasing loop 1004). Insulating layer 1104 can be deposited on device 1000 (e.g., onto substrate 604 and biasing loop 1004) using one or more material deposition techniques defined above (e.g., evaporation techniques, sputtering techniques, chemical vapor deposition (CVD), atomic layer deposition (ALD), physical vapor deposition (PVD), molecular beam epitaxy (MBE), electrochemical deposition (ECD), etc.). Insulating layer 1104 can be formed using a material including, but not limited to, silicon nitride (e.g., SiN, $Si_3N_4$, etc.), silicon dioxide ($SiO_2$), sapphire (e.g., aluminum oxide ($Al_2O_3$), and/or another material. Insulating layer 1104 can comprise a thickness (e.g., height) ranging from approximately 0 nm to approximately 30 nm. In an embodiment, insulating layer 1104 can comprise an insulating barrier.

Figure 12A:
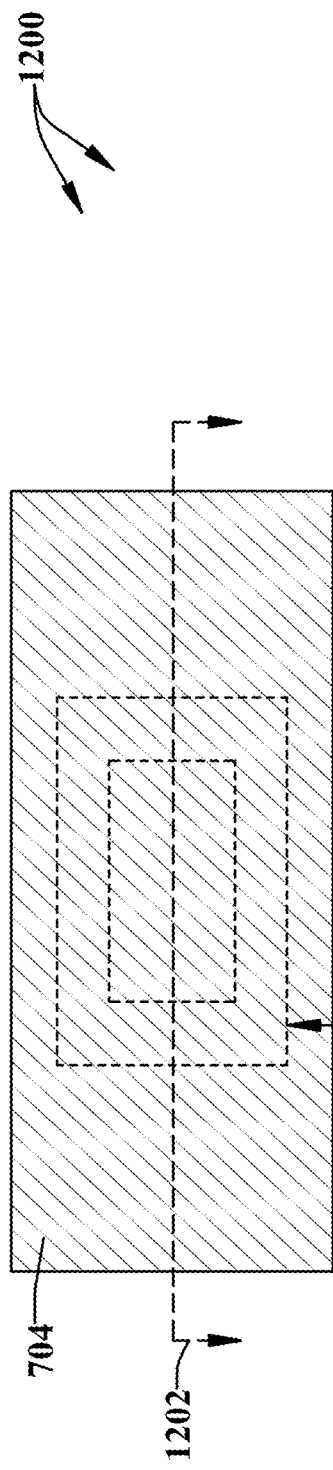
FIGS. 12A and 12B illustrate a top view and a cross-sectional view, respectively, of the example, non-limiting device of FIGS. 11A and 11B after forming a resist layer on the insulating layer in accordance with one or more embodiments described herein.
Figure 12B:
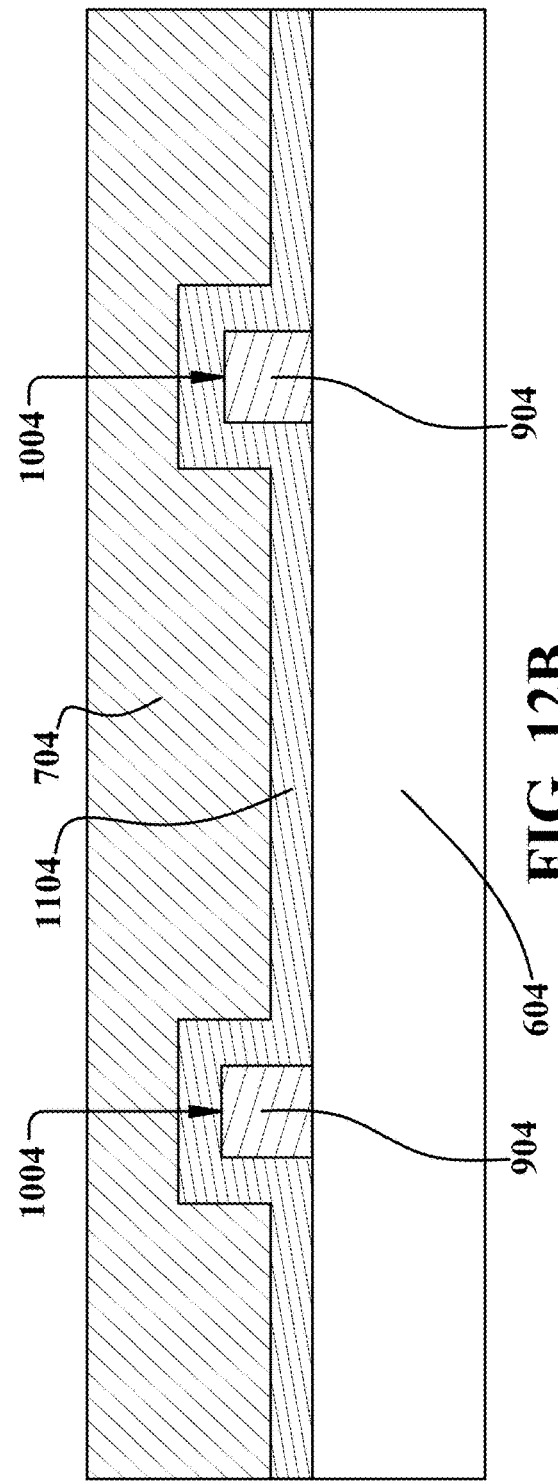

FIG. 12A illustrates a top view of the example, non-limiting device 1100 of FIGS. 11A and 11B after forming a resist layer on the insulating layer in accordance with one or more embodiments described herein. FIG. 12B illustrates a cross-sectional side view of device 1200 as viewed along a plane defined by line 1202. Repetitive description of like elements and/or processes employed in other embodiments described herein is omitted for sake of brevity.

Device 1200 can comprise an example, non-limiting alternative embodiment of device 1100 after formation of a second resist layer 704 on insulating layer 1104 as illustrated in FIGS. 12A and 12B. Resist layer 704 can comprise a photoresist material that can be formed on insulating layer 1104 using one or more photolithography, patterning, and/or photoresist techniques defined above (e.g., a lithographic patterning process). In an example, resist layer 704 can be deposited onto insulating layer 1104 using a spin coating technique. Resist layer 704 can comprise a photoresist including, but not limited to, a positive-tone photoresist, a negative-tone photoresist, a hybrid-tone photoresist, and/or another photoresist.

FIG. 13A illustrates a top view of the example, non-limiting device 1200 of FIGS. 12A and 12B after removing a portion the resist layer in accordance with one or more embodiments described herein. FIG. 13B illustrates a cross-sectional side view of device 1300 as viewed along a plane defined by line 1302. Repetitive description of like elements and/or processes employed in other embodiments described herein is omitted for sake of brevity.

Device 1300 can comprise an example, non-limiting alternative embodiment of device 1200 after removing a portion of resist layer 704 from insulating layer 1104 to form void 1304 and expose a surface of insulating layer 1104 as illustrated in FIGS. 13A and 13B. Void 1304 can be formed in resist layer 704 by removing a portion of resist layer 704 using one or more photolithography, patterning, and/or photoresist techniques defined above (e.g., a lithographic patterning process). In an example (not illustrated in the figures), resist layer 704 and/or void 1304 can be formed using an ion milling process to form a reverse profile of resist layer 704 and/or void 1304 on insulating layer 1104. Although void 1304 depicted in FIGS. 13A and 13B comprises a substantially rectangular shape, it should be appreciated that the subject disclosure is not so limiting. For example, void 1304 can be formed in any shape (e.g., a rectangular ring, a circular ring, a square ring, a triangular ring, a rectangle, a circle, a square, a triangle, a serpentine shape, etc.) that can enable fabrication and/or implementation of one or more embodiments of the subject disclosure that can facilitate local heating of a superconducting flux biasing loop as described herein (e.g., device 100, 200, 300a, 300b, 300c, 300d, 300e, 1900, 2600, system 400, 500, etc.).

FIG. 14A illustrates a top view of the example, non-limiting device 1300 of FIGS. 13A and 13B after depositing a resistive layer in accordance with one or more embodiments described herein. FIG. 14B illustrates a cross-sectional side view of device 1400 as viewed along a plane defined by line 1402. Repetitive description of like elements and/or processes employed in other embodiments described herein is omitted for sake of brevity.

Device 1400 can comprise an example, non-limiting alternative embodiment of device 1300 after depositing resistive layer 1404 on device 1300 as illustrated in FIGS. 14A and 14B (e.g., onto resist layer 704 and onto the exposed surface of insulating layer 1104 in void 1304). Resistive layer 1404 can be deposited on device 1300 (e.g., onto resist layer 704 and onto the exposed surface of insulating layer 1104 in void 1304) using one or more material deposition techniques defined above (e.g., evaporation techniques, sputtering techniques, chemical vapor deposition (CVD), atomic layer deposition (ALD), physical vapor deposition (PVD), molecular beam epitaxy (MBE), electrochemical deposition (ECD), etc.). Resistive layer 1404 can be formed using any material having resistive properties (e.g., non-superconducting properties) including, but not limited to, nichrome (NiCr), gold-palladium (AuPd), manganese (Mn), constantan (e.g., a copper-nickel alloy), and/or another resistive material (e.g., another normal metal). Resistive layer 1404 can comprise a thickness (e.g., height) ranging from approximately 5 nm to approximately 200 nm. Resistive layer 1404 can be deposited on device 1300 as illustrated in FIGS. 14A and 14B to form a resistive component such as, for instance, resistive material 1504 as described below and illustrated in FIGS. 15A and 15B.

Figure 15A:
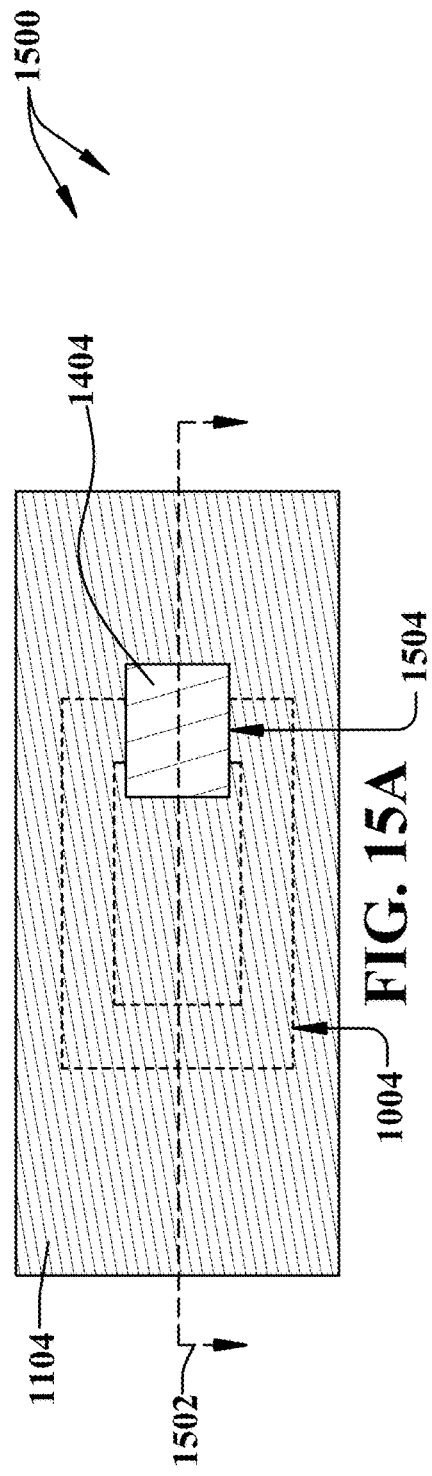
FIGS. 15A and 15B illustrate a top view and a cross-sectional view, respectively, of the example, non-limiting device of FIGS. 14A and 14B after removing the resist layer and portions of the resistive layer to form a resistive component in accordance with one or more embodiments described herein.
Figure 15B:
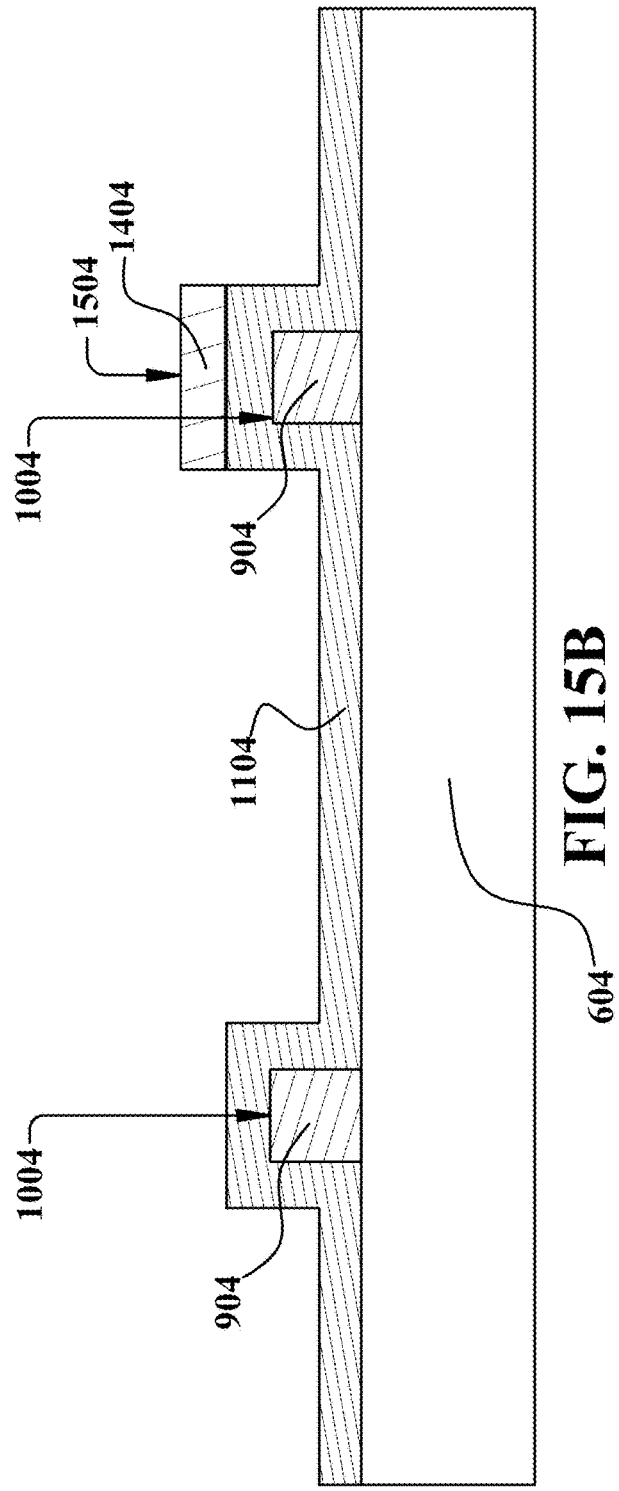

FIG. 15A illustrates a top view of the example, non-limiting device 1400 of FIGS. 14A and 14B after removing the resist layer and portions of the resistive layer to form a resistive component in accordance with one or more embodiments described herein. FIG. 15B illustrates a cross-sectional side view of device 1500 as viewed along a plane defined by line 1502. Repetitive description of like elements and/or processes employed in other embodiments described herein is omitted for sake of brevity.

Device 1500 can comprise an example, non-limiting alternative embodiment of device 1400 after removing resist layer 704 and the portions of resistive layer 1404 deposited on resist layer 704 to form resistive material 1504 as illustrated in FIGS. 15A and 15B. Resist layer 704 and the portions of resistive layer 1404 deposited on resist layer 704 can be removed using a lift off technique (e.g., washing with a solvent, stripping, etc.) to form resistive material 1504 on insulating layer 1104 as illustrated in FIGS. 15A and 15B. Resistive material 1504 can comprise the portion of resistive layer 1404 remaining on insulating layer 1104 after removing resist layer 704 and the portions of resistive layer 1404 deposited on resist layer 704 as described above. In an example, resistive material 1504 can comprise an example, non-limiting alternative embodiment of resistive material 106, 306a, 306b, 306c, 306d, and/or 306e described above and illustrated in FIGS. 1-5.

Figure 16A:
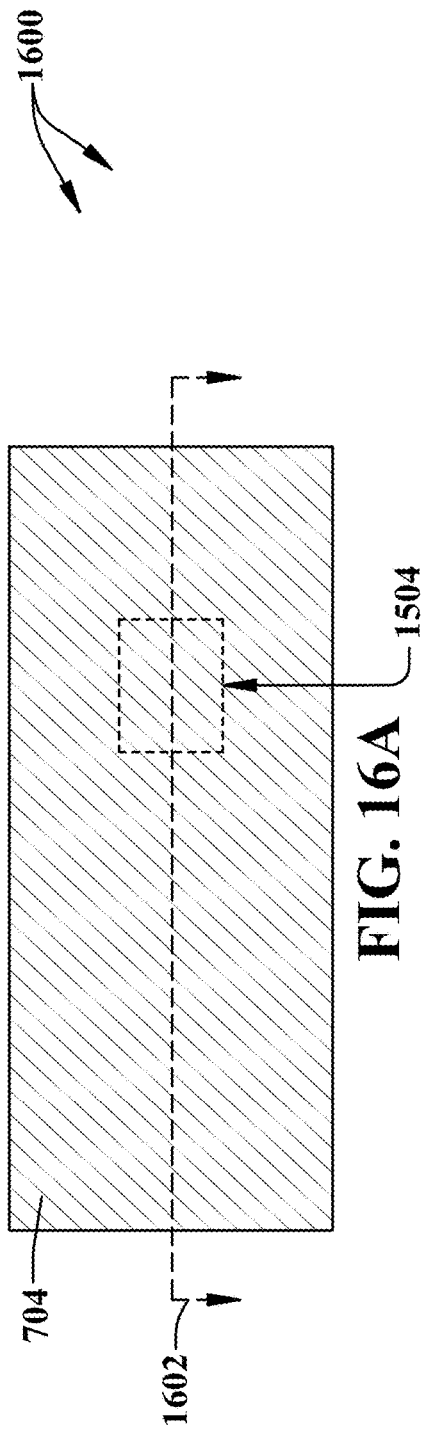
FIGS. 16A and 16B illustrate a top view and a cross-sectional view, respectively, of the example, non-limiting device of FIGS. 15A and 15B after forming a resist layer on the insulating layer and the resistive material in accordance with one or more embodiments described herein.
Figure 16B:
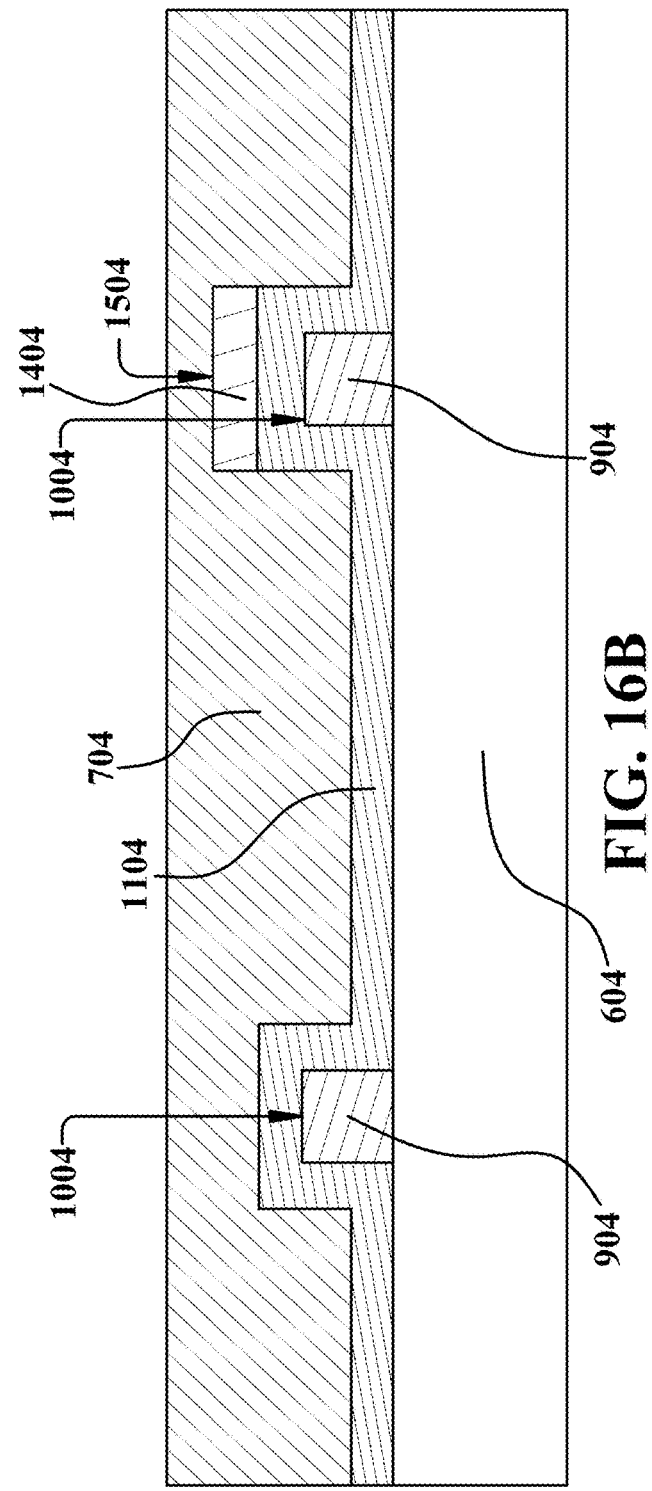

FIG. 16A illustrates a top view of the example, non-limiting device 1500 of FIGS. 15A and 15B after forming a resist layer on the insulating layer and the resistive material in accordance with one or more embodiments described herein. FIG. 16B illustrates a cross-sectional side view of device 1600 as viewed along a plane defined by line 1602. Repetitive description of like elements and/or processes employed in other embodiments described herein is omitted for sake of brevity.

Device 1600 can comprise an example, non-limiting alternative embodiment of device 1500 after formation of a third resist layer 704 on insulating layer 1104 and resistive material 1504 as illustrated in FIGS. 16A and 16B. Resist layer 704 can comprise a photoresist material that can be formed on insulating layer 1104 and resistive material 1504 using one or more photolithography, patterning, and/or photoresist techniques defined above (e.g., a lithographic patterning process). In an example, resist layer 704 can be deposited onto insulating layer 1104 and resistive material 1504 using a spin coating technique. Resist layer 704 can comprise a photoresist including, but not limited to, a positive-tone photoresist, a negative-tone photoresist, a hybrid-tone photoresist, and/or another photoresist.

FIG. 17A illustrates a top view of the example, non-limiting device 1600 of FIGS. 16A and 16B after removing portions of the resist layer in accordance with one or more embodiments described herein. FIG. 17B illustrates a cross-sectional side view of device 1700 as viewed along a plane defined by line 1702. Repetitive description of like elements and/or processes employed in other embodiments described herein is omitted for sake of brevity.

Device 1700 can comprise an example, non-limiting alternative embodiment of device 1600 after removing portions of resist layer 704 from insulating layer 1104 and resistive material 1504 to form voids 1704 and expose surfaces of insulating layer 1104 and resistive material 1504 as illustrated in FIGS. 17A and 17B. Voids 1704 can be formed in resist layer 704 by removing portions of resist layer 704 using one or more photolithography, patterning, and/or photoresist techniques defined above (e.g., a lithographic patterning process). In an example (not illustrated in the figures), resist layer 704 and/or voids 1704 can be formed using an ion milling process to form a reverse profile of resist layer 704 and/or voids 1704 on insulating layer 1104 and resistive material 1504. Although voids 1704 depicted in FIGS. 17A and 17B comprise a substantially rectangular shape, it should be appreciated that the subject disclosure is not so limiting. For example, voids 1704 can be formed in any shape that can enable fabrication and/or implementation of one or more embodiments of the subject disclosure that can facilitate local heating of a superconducting flux biasing loop as described herein (e.g., device 100, 200, 300a, 300b, 300c, 300d, 300e, 1900, 2600, system 400, 500, etc.).

Figure 18A:
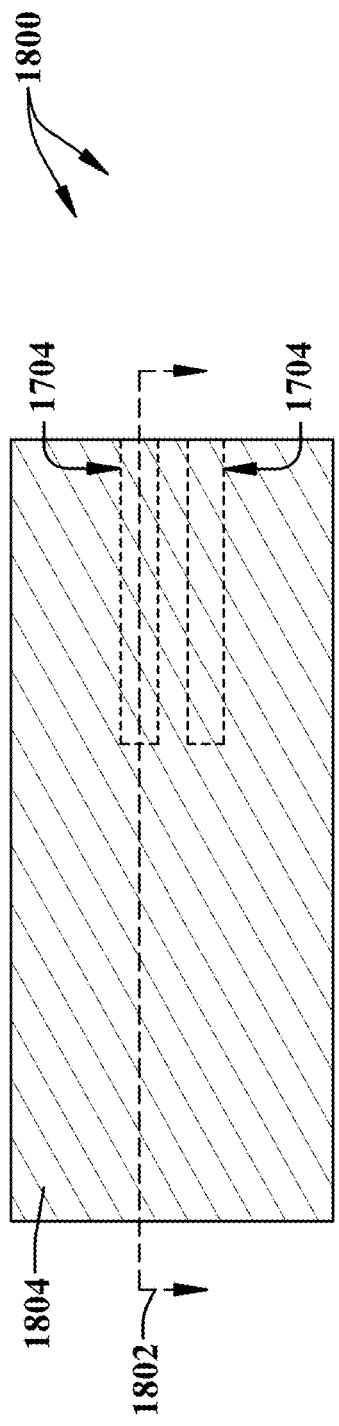
FIGS. 18A and 18B illustrate a top view and a cross-sectional view, respectively, of the example, non-limiting device of FIGS. 17A and 17B after depositing a second superconducting layer in accordance with one or more embodiments described herein.
Figure 18B:
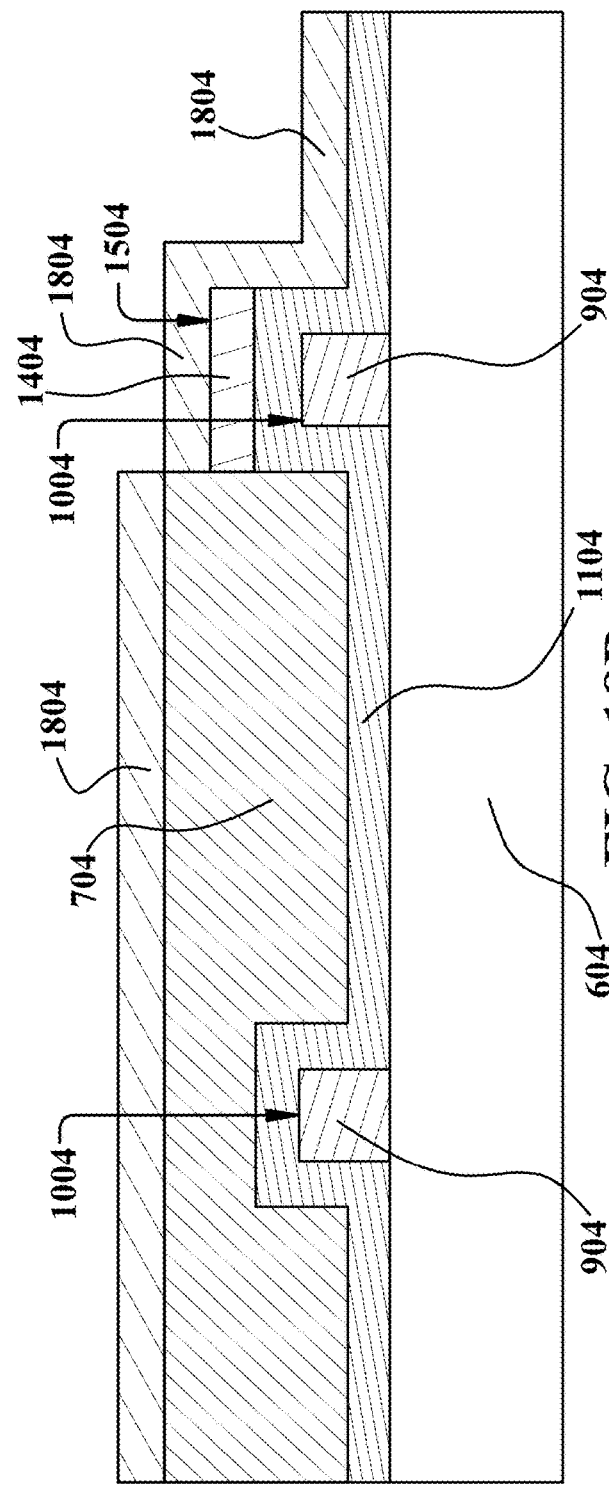

FIG. 18A illustrates a top view of the example, non-limiting device 1700 of FIGS. 17A and 17B after depositing a second superconducting layer in accordance with one or more embodiments described herein. FIG. 18B illustrates a cross-sectional side view of device 1800 as viewed along a plane defined by line 1802. Repetitive description of like elements and/or processes employed in other embodiments described herein is omitted for sake of brevity.

Device 1800 can comprise an example, non-limiting alternative embodiment of device 1700 after depositing a superconducting layer 1804 on device 1700 as illustrated in FIGS. 18A and 18B (e.g., onto resist layer 704 and onto the exposed surfaces of insulating layer 1104 and resistive material 1504 in voids 1704). Superconducting layer 1804 can be deposited on device 1700 (e.g., onto resist layer 704 and onto the exposed surfaces of insulating layer 1104 and resistive material 1504 in voids 1704) using one or more material deposition techniques defined above (e.g., evaporation techniques, sputtering techniques, chemical vapor deposition (CVD), atomic layer deposition (ALD), physical vapor deposition (PVD), molecular beam epitaxy (MBE), electrochemical deposition (ECD), etc.). Superconducting layer 1804 can be formed using a superconducting material including, but not limited to, Niobium (Nb), Niobium Nitride (NbN), Niobium Titanium Nitride (NbTiN), Niobium Titanium (NbTi), Niobium-Germanium ($Nb_3Ge$), and/or another material. Superconducting layer 1804 can comprise a thickness (e.g., height) ranging from approximately 10 nm to approximately 200 nm. Superconducting layer 1804 can be deposited on device 1700 as illustrated in FIGS. 18A and 18B to form superconducting heater bias wires such as, for instance, superconducting heater bias wires 1904 as described below and illustrated in FIGS. 19A and 19B.

FIG. 19A illustrates a top view of the example, non-limiting device 1800 of FIGS. 18A and 18B after removing the resist layer and portions of the second superconducting layer to form superconducting heater bias wires in accordance with one or more embodiments described herein. FIG. 19B illustrates a cross-sectional side view of device 1900 as viewed along a plane defined by line 1902. Repetitive description of like elements and/or processes employed in other embodiments described herein is omitted for sake of brevity.

Device 1900 can comprise an example, non-limiting alternative embodiment of device 1800 after removing resist layer 704 and the portions of superconducting layer 1804 deposited on resist layer 704 to form superconducting heater bias wires 1904 on insulating layer 1104 and resistive material 1504 as illustrated in FIGS. 19A and 19B. Resist layer 704 and the portions of superconducting layer 1804 deposited on resist layer 704 can be removed using a lift off technique (e.g., washing with a solvent, stripping, etc.) to form superconducting heater bias wires 1904 on insulating layer 1104 and resistive material 1504 as illustrated in FIGS. 19A and 19B. Superconducting heater bias wires 1904 can comprise the portions of superconducting layer 1804 remaining on insulating layer 1104 and resistive material 1504 after removing resist layer 704 and the portions of superconducting layer 1804 deposited on resist layer 704 as described above. In an example, superconducting heater bias wires 1904 can comprise example, non-limiting alternative embodiments of superconducting heater bias wires 108, 308a, 308b, 308c, 308d, and/or 308e described above and illustrated in FIGS. 1-5.

FIG. 20A illustrates a top view of the example, non-limiting device 700 of FIGS. 7A and 7B after removing a portion the resist layer in accordance with one or more embodiments described herein. FIG. 20B illustrates a cross-sectional side view of device 2000 as viewed along a plane defined by line 2002. Repetitive description of like elements and/or processes employed in other embodiments described herein is omitted for sake of brevity.

Device 2000 can comprise an example, non-limiting alternative embodiment of device 700 after removing a portion of resist layer 704 from substrate 604 to form void 2004 as illustrated in FIGS. 20A and 20B. Void 2004 can be formed in resist layer 704 by removing a portion of resist layer 704 using one or more photolithography, patterning, and/or photoresist techniques defined above (e.g., a lithographic patterning process). In an example (not illustrated in the figures), resist layer 704 and/or void 2004 can be formed using an ion milling process to form a reverse profile of resist layer 704 and/or void 2004 on substrate 604. Although void 2004 depicted in FIGS. 20A and 20B comprises a substantially "C" shaped void, it should be appreciated that the subject disclosure is not so limiting. For example, void 2004 can be formed in any shape that can enable fabrication and/or implementation of one or more embodiments of the subject disclosure that can facilitate local heating of a superconducting flux biasing loop as described herein (e.g., device 100, 200, 300a, 300b, 300c, 300d, 300e, 1900, 2600, system 400, 500, etc.).

FIG. 21A illustrates a top view of the example, non-limiting device 2000 of FIGS. 20A and 20B after depositing a first superconducting layer in accordance with one or more embodiments described herein. FIG. 21B illustrates a cross-sectional side view of device 2100 as viewed along a plane defined by line 2102. Repetitive description of like elements and/or processes employed in other embodiments described herein is omitted for sake of brevity.

Device 2100 can comprise an example, non-limiting alternative embodiment of device 2000 after depositing a superconducting layer 904 on device 2000 as illustrated in FIGS. 21A and 21B (e.g., onto resist layer 704 and onto the exposed surface of substrate 604 in void 2004). Superconducting layer 904 can be deposited on device 2000 (e.g., onto resist layer 704 and onto the exposed surface of substrate 604 in void 2004) using one or more material deposition techniques defined above (e.g., evaporation techniques, sputtering techniques, chemical vapor deposition (CVD), atomic layer deposition (ALD), physical vapor deposition (PVD), molecular beam epitaxy (MBE), electrochemical deposition (ECD), etc.). Superconducting layer 904 can be formed using a superconducting material including, but not limited to, Aluminum (Al), Titanium Nitride (TiN), Lanthanum (La), Molybdenum (Mo), Molybdenum Nitride (MoN), Tantalum (Ta), Tantalum Nitride (TaN), and/or another material. Superconducting layer 904 can comprise a thickness (e.g., height) ranging from approximately 10 nm to approximately 100 nm. Superconducting layer 904 can be deposited on device 2000 as illustrated in FIGS. 21A and 21B to form a first superconducting material of a biasing loop such as, for instance, first superconducting material 2204 as described below and illustrated in FIGS. 22A and 22B.

FIG. 22A illustrates a top view of the example, non-limiting device 2100 of FIGS. 21A and 21B after removing the resist layer and portions of the first superconducting layer to form a first superconducting material of a biasing loop on the substrate in accordance with one or more embodiments described herein. FIG. 22B illustrates a cross-sectional side view of device 2200 as viewed along a plane defined by line 2202. Repetitive description of like elements and/or processes employed in other embodiments described herein is omitted for sake of brevity.

Device 2200 can comprise an example, non-limiting alternative embodiment of device 2100 after removing resist layer 704 and the portions of superconducting layer 904 deposited on resist layer 704 to form a first superconducting material 2204 of a biasing loop on substrate 604 as illustrated in FIGS. 22A and 22B. Resist layer 704 and the portions of superconducting layer 904 deposited on resist layer 704 can be removed using a lift off technique (e.g., washing with a solvent, stripping, etc.) to form first superconducting material 2204 on substrate 604 as illustrated in FIGS. 22A and 22B. First superconducting material 2204 can comprise the portion of superconducting layer 904 remaining on substrate 604 after removing resist layer 704 and the portions of superconducting layer 904 deposited on resist layer 704 as described above.

In an example, first superconducting material 2204 can comprise a first superconducting material of a biasing loop comprising multiple superconducting materials that can be developed on substrate 604. For example, first superconducting material 2204 can comprise a first superconducting material of biasing loop 2606 described below and illustrated in FIGS. 26A and 26B (biasing loop 2606 is denoted by the bold dashed lines in FIGS. 26A and 26B), where biasing loop 2606 can comprise first superconducting material 2204 and second superconducting material 2604. In an embodiment, first superconducting material 2204 can comprise an example, non-limiting alternative embodiment of first superconducting material 310 of device 300e described above and illustrated in FIG. 3.

FIG. 23A illustrates a top view of the example, non-limiting device 2200 of FIGS. 22A and 22B after forming a resist layer on the first superconducting material and the substrate in accordance with one or more embodiments described herein. FIG. 23B illustrates a cross-sectional side view of device 2300 as viewed along a plane defined by line 2302. Repetitive description of like elements and/or processes employed in other embodiments described herein is omitted for sake of brevity.

Device 2300 can comprise an example, non-limiting alternative embodiment of device 2200 after formation of a second resist layer 704 on first superconducting material 2204 and substrate 604 as illustrated in FIGS. 23A and 23B. Resist layer 704 can comprise a photoresist material that can be formed on first superconducting material 2204 and substrate 604 using one or more photolithography, patterning, and/or photoresist techniques defined above (e.g., a lithographic patterning process). In an example, resist layer 704 can be deposited onto first superconducting material 2204 and substrate 604 using a spin coating technique. Resist layer 704 can comprise a photoresist including, but not limited to, a positive-tone photoresist, a negative-tone photoresist, a hybrid-tone photoresist, and/or another photoresist.

FIG. 24A illustrates a top view of the example, non-limiting device 2300 of FIGS. 23A and 23B after removing a portion of the resist layer in accordance with one or more embodiments described herein. FIG. 24B illustrates a cross-sectional side view of device 2400 as viewed along a plane defined by line 2402. Repetitive description of like elements and/or processes employed in other embodiments described herein is omitted for sake of brevity.

Device 2400 can comprise an example, non-limiting alternative embodiment of device 2300 after removing a portion of resist layer 704 from first superconducting material 2204 and substrate 604 to form void 2404 and expose surfaces of first superconducting material 2204 and substrate 604 as illustrated in FIGS. 24A and 24B. Void 2404 can be formed in resist layer 704 by removing portions of resist layer 704 using one or more photolithography, patterning, and/or photoresist techniques defined above (e.g., a lithographic patterning process). In an example (not illustrated in the figures), resist layer 704 and/or void 2404 can be formed using an ion milling process to form a reverse profile of resist layer 704 and/or void 2404 on first superconducting material 2204 and substrate 604. Although void 2404 depicted in FIGS. 24A and 24B comprises a substantially rectangular shape, it should be appreciated that the subject disclosure is not so limiting. For example, void 2404 can be formed in any shape that can enable fabrication and/or implementation of one or more embodiments of the subject disclosure that can facilitate local heating of a superconducting flux biasing loop as described herein (e.g., device 100, 200, 300a, 300b, 300c, 300d, 300e, 1900, 2600, system 400, 500, etc.).

FIG. 25A illustrates a top view of the example, non-limiting device 2400 of FIGS. 24A and 24B after depositing a second superconducting layer in accordance with one or more embodiments described herein. FIG. 25B illustrates a cross-sectional side view of device 2500 as viewed along a plane defined by line 2502. Repetitive description of like elements and/or processes employed in other embodiments described herein is omitted for sake of brevity.

Device 2500 can comprise an example, non-limiting alternative embodiment of device 2400 after depositing a superconducting layer 2504 on device 2400 as illustrated in FIGS. 25A and 25B (e.g., onto resist layer 704 and onto the exposed surfaces of first superconducting material 2204 and substrate 604 in void 2404). Superconducting layer 2504 can be deposited on device 2400 (e.g., onto resist layer 704 and onto the exposed surfaces of first superconducting material 2204 and substrate 604 in void 2404) using one or more material deposition techniques defined above (e.g., evaporation techniques, sputtering techniques, chemical vapor deposition (CVD), atomic layer deposition (ALD), physical vapor deposition (PVD), molecular beam epitaxy (MBE), electrochemical deposition (ECD), etc.). Superconducting layer 2504 can be formed using a superconducting material including, but not limited to, Titanium (Ti), Aluminum (Al), Rhenium (Re), Zinc (Zn), Zirconium (Zr), Hafnium (Hf), and/or another material. Superconducting layer 2504 can comprise a thickness (e.g., height) ranging from approximately 10 nm to approximately 100 nm. Superconducting layer 2504 can be deposited on device 2400 as illustrated in FIGS. 25A and 25B to form a second superconducting material of a biasing loop such as, for instance, second superconducting material 2604 as described below and illustrated in FIGS. 26A and 26B.

FIG. 26A illustrates a top view of the example, non-limiting device 2500 of FIGS. 25A and 25B after removing the resist layer and portions of the second superconducting layer to form a second superconducting material of a biasing loop formed on the substrate in accordance with one or more embodiments described herein. FIG. 26B illustrates a cross-sectional side view of device 2600 as viewed along a plane defined by line 2602. Repetitive description of like elements and/or processes employed in other embodiments described herein is omitted for sake of brevity.

Device 2600 can comprise an example, non-limiting alternative embodiment of device 2500 after removing resist layer 704 and the portions of superconducting layer 2504 deposited on resist layer 704 to form a second superconducting material 2604 of biasing loop 2606 formed on substrate 604 as illustrated in FIGS. 26A and 26B (biasing loop 2606 is denoted by the bold dashed lines in FIGS. 26A and 26B). Resist layer 704 and the portions of superconducting layer 2504 deposited on resist layer 704 can be removed using a lift off technique (e.g., washing with a solvent, stripping, etc.) to form second superconducting material 2604 on first superconducting material 2204 and substrate 604 as illustrated in FIGS. 26A and 26B. Second superconducting material 2604 can comprise the portion of superconducting layer 2504 remaining on first superconducting material 2204 and substrate 604 after removing resist layer 704 and the portions of superconducting layer 2504 deposited on resist layer 704 as described above.

In an example, second superconducting material 2604 can comprise a second superconducting material of biasing loop 2606, which can comprise multiple superconducting materials that can be developed on substrate 604. For example, as illustrated in FIGS. 26A and 26B biasing loop 2606 can comprise first superconducting material 2204 and second superconducting material 2604. In an embodiment, second superconducting material 2604 can comprise an example, non-limiting alternative embodiment of second superconducting material 312 of device 300e described above and illustrated in FIG. 3.

Although not illustrated in the figures, it should be appreciated that device 2600 can be developed further into one or more embodiments of the subject disclosure that can facilitate local heating of a superconducting flux biasing loop as described herein (e.g., device 100, 200, 300e, system 400, 500, etc.). In some embodiments, one or more of the fabrication steps of the non-limiting multi-step fabrication sequence described above and illustrated in FIGS. 6A-19B can be implemented to facilitate such further development of device 2600 into one or more embodiments of the subject disclosure that can facilitate local heating of a superconducting flux biasing loop as described herein (e.g., device 100, 200, 300e, system 400, 500, etc.). For example, the fabrication steps described above and illustrated in FIGS. 11A-11B can be implemented to form insulating layer 1104 on substrate 604 and biasing loop 2606 of device 2600. In another example, the fabrication steps described above and illustrated in FIGS. 12A-15B can be implemented to form resistive material 1504 on one or more portions of insulating layer 1104 that can be deposited on substrate 604 and biasing loop 2606 of device 2600 as described above. In another example, the fabrication steps described above and illustrated in FIGS. 16A-19B can be implemented to form superconducting heater bias wires 1904 on portions of resistive material 1504 and insulating layer 1104 that can be deposited on device 2600 as described above. In an embodiment where device 2600 is developed further as described above to form insulating layer 1104, resistive material 1504, and superconducting heater bias wires 1904 on device 2600, such a further developed embodiment of device 2600 can comprise an example, non-limiting alternative embodiment of device 300e described above and illustrated in FIG. 3.

The various embodiments of the subject disclosure described herein (e.g., device 100, 200, 300a, 300b, 300c, 300d, 300e, 1900, 2600, system 400, 500, etc.) can be associated with various technologies. For example, the various embodiments of the subject disclosure described herein (e.g., device 100, 200, 300a, 300b, 300c, 300d, 300e, 1900, 2600, system 400, 500, etc.) can be associated with semiconductor and/or superconductor device technologies, semiconductor and/or superconductor device fabrication technologies, quantum computing device technologies, quantum computing device fabrication technologies, superconducting flux bias circuit technologies, superconducting flux bias circuit fabrication technologies, flux controlled qubit device technologies, flux controlled qubit device fabrication technologies, and/or other technologies.

The various embodiments of the subject disclosure described herein (e.g., device 100, 200, 300a, 300b, 300c, 300d, 300e, 1900, 2600, system 400, 500, etc.) can provide technical improvements to the various technologies listed above. For example, the various embodiments of the subject disclosure described herein (e.g., device 100, 200, 300a, 300b, 300c, 300d, 300e, 1900, 2600, system 400, 500, etc.) can enable individual and/or simultaneous local heating of one or more biasing loops in a superconducting flux bias circuit to individually and/or simultaneously control superconductivity of the biasing loop(s) and/or a magnetic field of the biasing loop(s). In this example, by enabling such individual and/or simultaneous control of the superconductivity of the biasing loop(s) and/or a magnetic field of the biasing loop(s), the various embodiments of the subject disclosure described herein (e.g., device 100, 200, 300*a*, 300*b*, 300*c*, 300*d*, 300*e*, 1900, 2600, system 400, 500, etc.) can enable individual and/or simultaneous tuning of one or more flux controlled qubit devices (e.g., a qubit, a SQUID loop, etc.) coupled to the biasing loop(s). In this example, by enabling such individual and/or simultaneous tuning of the flux controlled qubit device(s) coupled to the biasing loop(s), the various embodiments of the subject disclosure described herein (e.g., device 100, 200, 300*a*, 300*b*, 300*c*, 300*d*, 300*e*, 1900, 2600, system 400, 500, etc.) can thereby facilitate at least one of improved fidelity of the flux controlled qubit device(s), improved fidelity of a quantum device comprising the flux controlled qubit device(s), or improved performance of a quantum device comprising the flux controlled qubit device(s).

The various embodiments of the subject disclosure described herein (e.g., device 100, 200, 300*a*, 300*b*, 300*c*, 300*d*, 300*e*, 1900, 2600, system 400, 500, etc.) can provide technical improvements to a processing unit associated with one or more of the various embodiments of the subject disclosure described herein (e.g., device 100, 200, 300*a*, 300*b*, 300*c*, 300*d*, 300*e*, 1900, 2600, system 400, 500, etc.). For example, as described above, the various embodiments of the subject disclosure described herein (e.g., device 100, 200, 300*a*, 300*b*, 300*c*, 300*d*, 300*e*, 1900, 2600, system 400, 500, etc.) can facilitate at least one of improved fidelity of the flux controlled qubit device(s), improved fidelity of a quantum device comprising the flux controlled qubit device(s), or improved performance of a quantum device comprising the flux controlled qubit device(s). In this example, such a quantum device can comprise a processing unit such as, for example, a quantum processor comprising one or more of the various embodiments of the subject disclosure described herein (e.g., device 100, 200, 300*a*, 300*b*, 300*c*, 300*d*, 300*e*, 1900, 2600, system 400, 500, etc.). Such improvement(s) to such a processing unit can further facilitate improved accuracy and/or efficiency of the processing unit, as well as reduced computational costs of the processing unit.

A practical application of the various embodiments of the subject disclosure described herein (e.g., device 100, 200, 300*a*, 300*b*, 300*c*, 300*d*, 300*e*, 1900, 2600, system 400, 500, etc.) is they can be implemented in a quantum computing device (e.g., a quantum processor, a quantum computer, etc.) to improve processing fidelity, processing performance, and/or processing costs of such a device, which can facilitate fast and/or possibly universal quantum computing. Such a practical application can improve the output (e.g., computation and/or processing results) of one or more compilation jobs (e.g., quantum computing jobs) that are executed on such a device(s).

It should be appreciated that the various embodiments of the subject disclosure described herein (e.g., device 100, 200, 300*a*, 300*b*, 300*c*, 300*d*, 300*e*, 1900, 2600, system 400, 500, etc.) provide a new approach for locally heating one or more biasing loops in a superconducting flux bias circuit individually and/or simultaneously to tune one or more flux controlled qubit devices (e.g., a qubit, a SQUID loop, etc.) coupled to the biasing loop(s) individually and/or simultaneously which is driven by relatively new quantum computing technologies. For example, the various embodiments of the subject disclosure described herein (e.g., device 100, 200, 300*a*, 300*b*, 300*c*, 300*d*, 300*e*, 1900, 2600, system 400, 500, etc.) provide a new approach for individually and/or simultaneously tuning one or more flux controlled qubit devices (e.g., a qubit, a SQUID loop, etc.) coupled to the biasing loop(s) of the superconducting flux bias circuit(s) that can facilitate at least one of improved fidelity of the flux controlled qubit device(s), improved fidelity of a quantum device comprising the flux controlled qubit device(s), or improved performance of a quantum device comprising the flux controlled qubit device(s).

The various embodiments of the subject disclosure described herein (e.g., device 100, 200, 300*a*, 300*b*, 300*c*, 300*d*, 300*e*, 1900, 2600, system 400, 500, etc.) can be coupled to hardware and/or software to solve problems that are highly technical in nature, that are not abstract and that cannot be performed as a set of mental acts by a human. For example, the various embodiments of the subject disclosure described herein (e.g., device 100, 200, 300*a*, 300*b*, 300*c*, 300*d*, 300*e*, 1900, 2600, system 400, 500, etc.) can be implemented in a quantum computing device that can process information and/or execute calculations that are not abstract and that cannot be performed as a set of mental acts by a human.

It should be appreciated that the various embodiments of the subject disclosure described herein (e.g., device 100, 200, 300*a*, 300*b*, 300*c*, 300*d*, 300*e*, 1900, 2600, system 400, 500, etc.) can utilize various combinations of electrical components, mechanical components, and circuitry that cannot be replicated in the mind of a human or performed by a human. For example, facilitating individual and/or simultaneous tuning of one or more flux controlled qubit devices (e.g., a qubit, a SQUID loop, etc.) in a quantum computing device is an operation that is greater than the capability of a human mind. For instance, the amount of data processed, the speed of processing such data, and/or the types of data processed over a certain period of time by such a quantum computing device utilizing the various embodiments of the subject disclosure described herein (e.g., device 100, 200, 300*a*, 300*b*, 300*c*, 300*d*, 300*e*, 1900, 2600, system 400, 500, etc.) can be greater, faster, and/or different than the amount, speed, and/or data type that can be processed by a human mind over the same period of time.

The various embodiments of the subject disclosure described herein (e.g., device 100, 200, 300*a*, 300*b*, 300*c*, 300*d*, 300*e*, 1900, 2600, system 400, 500, etc.) can also be fully operational towards performing one or more other functions (e.g., fully powered on, fully executed, etc.) while also performing the above-referenced operations. It should also be appreciated that such simultaneous multi-operational execution is beyond the capability of a human mind. It should also be appreciated that the various embodiments of the subject disclosure described herein (e.g., device 100, 200, 300*a*, 300*b*, 300*c*, 300*d*, 300*e*, 1900, 2600, system 400, 500, etc.) can include information that is impossible to obtain manually by an entity, such as a human user. For example, the type, amount, and/or variety of information included in and/or processed by the various embodiments of the subject disclosure described herein (e.g., device 100, 200, 300*a*, 300*b*, 300*c*, 300*d*, 300*e*, 1900, 2600, system 400, 500, etc.) can be more complex than information obtained manually by a human user.

The example, non-limiting multi-step fabrication sequences described above with reference to FIGS. 6A-26B, which can be implemented to fabricate one or more embodiments of the subject disclosure described herein and/or illustrated in the figures, can be implemented by a computing system (e.g., operating environment 2700 illustrated in FIG. 27 and described below) and/or a computing device (e.g., computer 2712 illustrated in FIG. 27 and described below). In non-limiting example embodiments, such computing system (e.g., operating environment 2700) and/or such computing device (e.g., computer 2712) can comprise one or more processors and one or more memory devices that can store executable instructions thereon that, when executed by the one or more processors, can facilitate performance of the example, non-limiting multi-step fabrication operations described herein with reference to FIGS. 6A-26B. As a non-limiting example, the one or more processors can facilitate performance of the example, non-limiting multi-step fabrication operations described herein with reference to FIGS. 6A-26B by directing and/or controlling one or more systems and/or equipment operable to perform semiconductor and/or superconductor device fabrication.

For simplicity of explanation, the methodologies described herein (e.g., computer-implemented methodologies) are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies described herein (e.g., computer-implemented methodologies) in accordance with the disclosed subject matter. In addition, those skilled in the art will understand and appreciate that such methodologies could alternatively be represented as a series of interrelated states via a state diagram or events. Additionally, it should be further appreciated that the methodologies (e.g., computer-implemented methodologies) disclosed hereinafter and throughout this specification are capable of being stored on an article of manufacture to facilitate transporting and transferring such methodologies (e.g., computer-implemented methodologies) to computers. The term article of manufacture, as used herein, is intended to encompass a computer program accessible from any computer-readable device or storage media.

Figure 27:
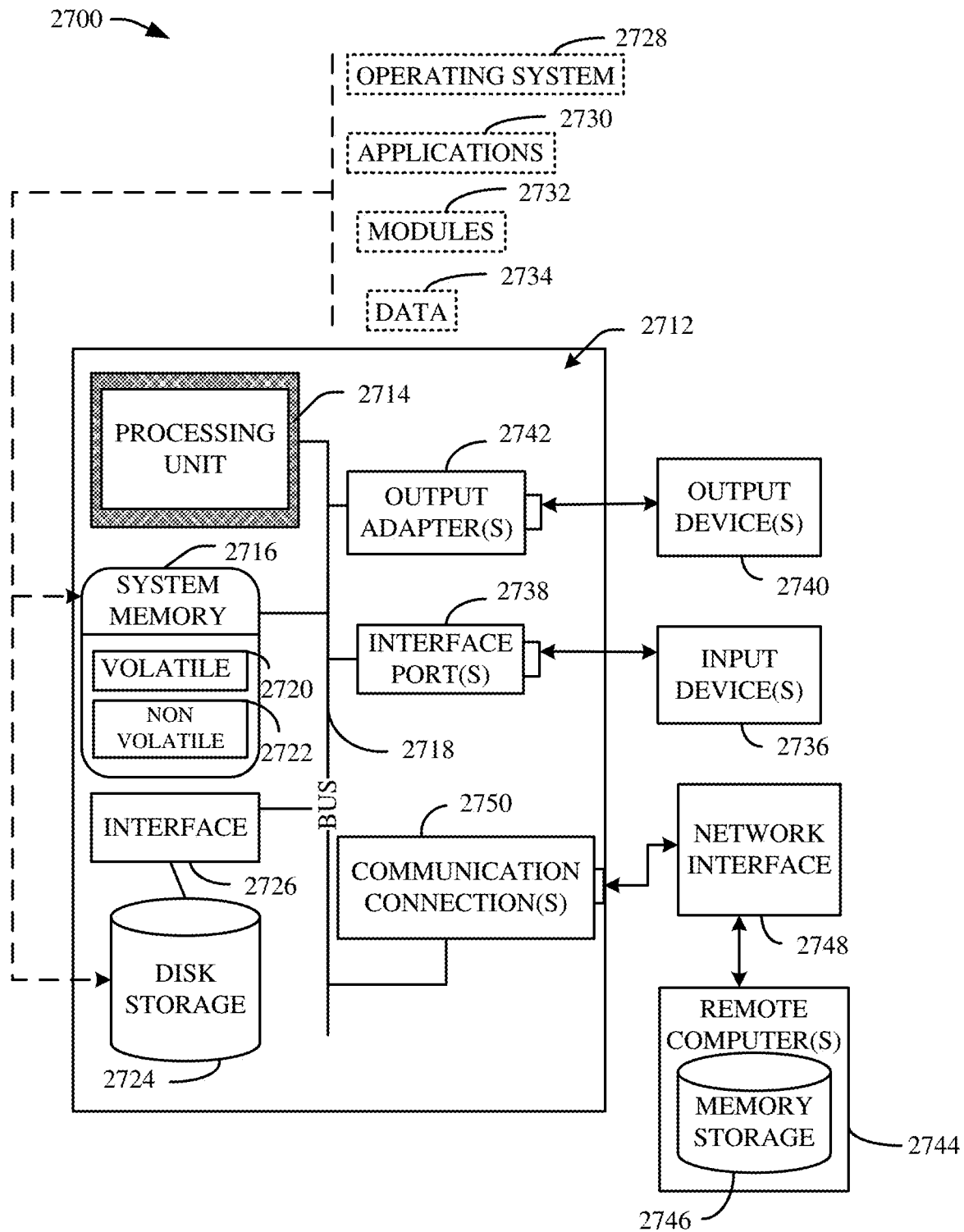
FIG. 27 illustrates a block diagram of an example, non-limiting operating environment in which one or more embodiments described herein can be facilitated.

In order to provide a context for the various aspects of the disclosed subject matter, FIG. 27 as well as the following discussion are intended to provide a general description of a suitable environment in which the various aspects of the disclosed subject matter can be implemented. FIG. 27 illustrates a block diagram of an example, non-limiting operating environment in which one or more embodiments described herein can be facilitated. For example, operating environment 2700 can be used to implement the example, non-limiting multi-step fabrication operations described herein with reference to FIGS. 6A-26B which can facilitate implementation of one or more embodiments of the subject disclosure described herein. Repetitive description of like elements and/or processes employed in other embodiments described herein is omitted for sake of brevity.

With reference to FIG. 27, a suitable operating environment 2700 for implementing various aspects of this disclosure can also include a computer 2712. The computer 2712 can also include a processing unit 2714, a system memory 2716, and a system bus 2718. The system bus 2718 couples system components including, but not limited to, the system memory 2716 to the processing unit 2714. The processing unit 2714 can be any of various available processors. Dual microprocessors and other multiprocessor architectures also can be employed as the processing unit 2714. The system bus 2718 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 2716 can also include volatile memory 2720 and nonvolatile memory 2722. The basic input/output system (BIOS), containing the basic routines to transfer information between elements within the computer 2712, such as during start-up, is stored in nonvolatile memory 2722. Computer 2712 can also include removable/non-removable, volatile/nonvolatile computer storage media. FIG. 27 illustrates, for example, a disk storage 2724. Disk storage 2724 can also include, but is not limited to, devices like a magnetic disk drive, floppy disk drive, tape drive, Jaz drive, Zip drive, LS-100 drive, flash memory card, or memory stick. The disk storage 2724 also can include storage media separately or in combination with other storage media. To facilitate connection of the disk storage 2724 to the system bus 2718, a removable or non-removable interface is typically used, such as interface 2726. FIG. 27 also depicts software that acts as an intermediary between users and the basic computer resources described in the suitable operating environment 2700. Such software can also include, for example, an operating system 2728. Operating system 2728, which can be stored on disk storage 2724, acts to control and allocate resources of the computer 2712.

System applications 2730 take advantage of the management of resources by operating system 2728 through program modules 2732 and program data 2734, e.g., stored either in system memory 2716 or on disk storage 2724. It is to be appreciated that this disclosure can be implemented with various operating systems or combinations of operating systems. A user enters commands or information into the computer 2712 through input device(s) 2736. Input devices 2736 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2714 through the system bus 2718 via interface port(s) 2738. Interface port(s) 2738 include, for example, a serial port, a parallel port, a game port, and a universal serial bus (USB). Output device(s) 2740 use some of the same type of ports as input device(s) 2736. Thus, for example, a USB port can be used to provide input to computer 2712, and to output information from computer 2712 to an output device 2740. Output adapter 2742 is provided to illustrate that there are some output devices 2740 like monitors, speakers, and printers, among other output devices 2740, which require special adapters. The output adapters 2742 include, by way of illustration and not limitation, video and sound cards that provide a means of connection between the output device 2740 and the system bus 2718. It should be noted that other devices and/or systems of devices provide both input and output capabilities such as remote computer(s) 2744.

Computer 2712 can operate in a networked environment using logical connections to one or more remote computers, such as remote computer(s) 2744. The remote computer(s) 2744 can be a computer, a server, a router, a network PC, a workstation, a microprocessor based appliance, a peer device or other common network node and the like, and typically can also include many or all of the elements described relative to computer 2712. For purposes of brevity, only a memory storage device 2746 is illustrated with remote computer(s) 2744. Remote computer(s) 2744 is logically connected to computer 2712 through a network interface 2748 and then physically connected via communication connection 2750. Network interface 2748 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 2750 refers to the hardware/software employed to connect the network interface 2748 to the system bus 2718. While communication connection 2750 is shown for illustrative clarity inside computer 2712, it can also be external to computer 2712. The hardware/software for connection to the network interface 2748 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices. For example, in one or more embodiments, computer executable components can be executed from memory that can include or be comprised of one or more distributed memory units. As used herein, the term "memory" and "memory unit" are interchangeable. Further, one or more embodiments described herein can execute code of the computer executable components in a distributed manner, e.g., multiple processors combining or working cooperatively to execute code from one or more distributed memory units. As used herein, the term "memory" can encompass a single memory or memory unit at one location or multiple memories or memory units at one or more locations.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
    a substrate having a superconducting flux bias circuit comprising a biasing loop coupled to a flux controlled qubit device, wherein the flux controlled qubit device comprises a superconducting quantum interference device loop; and
    a heating device coupled to and between the biasing loop and one or more superconducting heater bias wires.

2. The device of claim 1, wherein the biasing loop comprises a persistent flux bias loop.

3. The device of claim 1, wherein the heating device comprises a resistor thermally coupled to the biasing loop.

4. The device of claim 1, wherein the heating device comprises superconducting heater bias wires coupled to a resistive material.

5. The device of claim 1, wherein the heating device comprises superconducting heater bias wires having a first critical temperature that is higher than a second critical temperature of the biasing loop.

6. The device of claim 1, wherein the heating device is thermally coupled to the biasing loop to heat at least one segment of the biasing loop above a critical temperature of the biasing loop.

7. The device of claim 1, wherein the heating device is thermally coupled to the biasing loop controlling superconductivity of the biasing loop and a magnetic field of the biasing loop, and thereby facilitating at least one of improved fidelity of the flux controlled qubit device, improved fidelity of a quantum device comprising the flux controlled qubit device, or improved performance of the quantum device comprising the flux controlled qubit device.

8. A device, comprising:
    a superconducting flux bias circuit comprising a flux controlled qubit device coupled to a biasing loop comprising a first critical temperature material and a second critical temperature material, and wherein the biasing loop is integrated into and formed in its entirety on a surface of the substrate; and
    a heating device coupled to and between the biasing loop and one or more superconducting heater bias wires.

9. The device of claim 8, wherein the first critical temperature material comprises a first superconducting material having a first critical temperature and the second critical temperature material comprises a second superconducting material having a second critical temperature that is lower than the first critical temperature.

10. The device of claim 8, wherein the biasing loop comprises a persistent flux bias loop, and wherein the flux controlled qubit device comprises at least one of a qubit or a superconducting quantum interference device loop.

11. The device of claim 8, wherein the heating device comprises a resistor thermally coupled to the biasing loop.

12. The device of claim 8, wherein the heating device comprises superconducting heater bias wires coupled to a resistive material.

13. The device of claim 8, wherein the heating device comprises superconducting heater bias wires having a critical temperature that is higher than at least one of a first critical temperature of the first critical temperature material or a second critical temperature of the second critical temperature material.

14. The device of claim 8, wherein the heating device is thermally coupled to the biasing loop to heat the second critical temperature material above a critical temperature of the second critical temperature material.

\* \* \* \* \*